United States Patent [19]

Osborne et al.

[11] 4,291,385
[45] Sep. 22, 1981

[54] CALCULATOR HAVING MERGED KEY CODES

[75] Inventors: Thomas E. Osborne, San Francisco; Richard K. Stockwell, Palo Alto, both of Calif.

[73] Assignee: Hewlett-Packard Company, Palo Alto, Calif.

[21] Appl. No.: 842,134

[22] Filed: Oct. 14, 1977

Related U.S. Application Data

[62] Division of Ser. No. 425,341, Dec. 17, 1973, Pat. No. 4,099,246.

[51] Int. Cl.$^3$ .................................................. G06F 3/02
[52] U.S. Cl. ................................... 364/709; 364/706
[58] Field of Search ............................. 364/709, 706

[56] References Cited

U.S. PATENT DOCUMENTS 3,860,808   1/1975   Sakoda et al. ...................... 364/709

Primary Examiner—Errol A. Krass
Attorney, Agent, or Firm—Patrick J. Barrett

[57] ABSTRACT

A hand-held, programmable, electronic calculator is capable of performing a larger number of functions than the number of keys on its keyboard and has one or more prefix keys to allow one function key to initiate more than one function. Each key generates a unique key code when it is depressed, and the calculator may be programmed by storing a series of the key codes in a memory. Memory space can be saved by generating unique merged codes to represent the combination of a prefix key and a function key, and storing this single merged code rather than the two key codes.

2 Claims, 3 Drawing Figures

CALCULATOR HAVING MERGED KEY CODES

This is a division of application Ser. No. 425,341, filed Dec. 17, 1973, and now U.S. Pat. No. 4,099,246.

BACKGROUND OF THE INVENTION

Electronic calculators are currently available for producing a wide variety of mathematical and manipulative operations formerly performed only by larger computers. The development of these calculators has been due in large part to the development of large-scale integrated circuits which have enabled calculator designers to implement a large number of computing circuits into very small packages. With this reduction in size of calculator components, many hand-held electronic calculators that perform sophisticated mathematical functions have become available. The number of functions that can be performed by hand-held calculators is usually limited by the number of keys that can be conveniently placed on the keyboard, rather than the number of the functions that can be performed by the circuitry inside the calculator, since a keyboard must be sufficiently large for a human operator to conveniently actuate the keys. Some calculator designers have alleviated this problem by providing a shift or prefix key that enables one or more of the other keys on the keyboard to initiate more than one calculator function. Examples of such calculators are the Hewlett-Packard Models 45 and 80.

A number of electronic calculators available today not only have the ability to perform sophisticated mathematical operations but they are programmable as well, enabling the calculator user to store a program of manipulative operations for later utilization. Programmable calculators often store such programs as a sequence of coded instructions usually called words or key codes. The storage memory usually has a given number of fixed-length positions in which these key codes can be stored, and the complexity of the programs the calculator can execute is often limited by the length of the program storage memory.

The stored program in a hand-held, programmable, electronic calculator usually comprises a series of key codes in a memory that correspond to the sequence keys a user would depress is he were performing the program manually. If some of the steps in the program comprise functions that are accessed from the calculator keyboard by first using a prefix key, then the program will have to store the prefix instruction as well as the instruction for the mathematical operation. If the program includes a significant number of such functions requiring the use of the prefix key, then a significant amount of the program storage space may be used up with the prefix instructions.

SUMMARY OF THE INVENTION

It is an object of this invention to reduce the amount of storage space required in a programmable, electronic calculator by multi-key instructions.

In accordance with the preferred embodiment of the present invention means are provided for generating a single key code, herein called a merged code, for each of several functions requiring a prefix key and a function key to initiate the function. A portable, programmable, electronic calculator may have, for example, 35 keys on its keyboard. A unique key code in the form of a binary number is usually assigned to each key and thus a calculator having 35 keys requires a six-digit binary code to uniquely represent each key. However, six binary digits can represent up to 64 unique combinations and a calculator having only 35 keys thus has 29 spare or unused key codes. Some or all of these spare key codes can be used to represent those functions that are accessible from the keyboard only by first actuating a prefix key. When the calculator is being programmed, each key code is entered into the program memory after the corresponding key is depressed. When a prefix key is depressed, a flag is also set in a status register in the calculator. If the following key is one that may be both validly prefixed by and merged with the preceding key, the flag in the status register causes the calculator to replace the previously stored prefix key code by a merged key code representing both the prefix and the subsequently depressed key. The merged key codes thus save program memory space by storing only a single code representative of the desired operation.

DESCRIPTION OF THE PREFERRED EMBODIMENT

Figure 1:
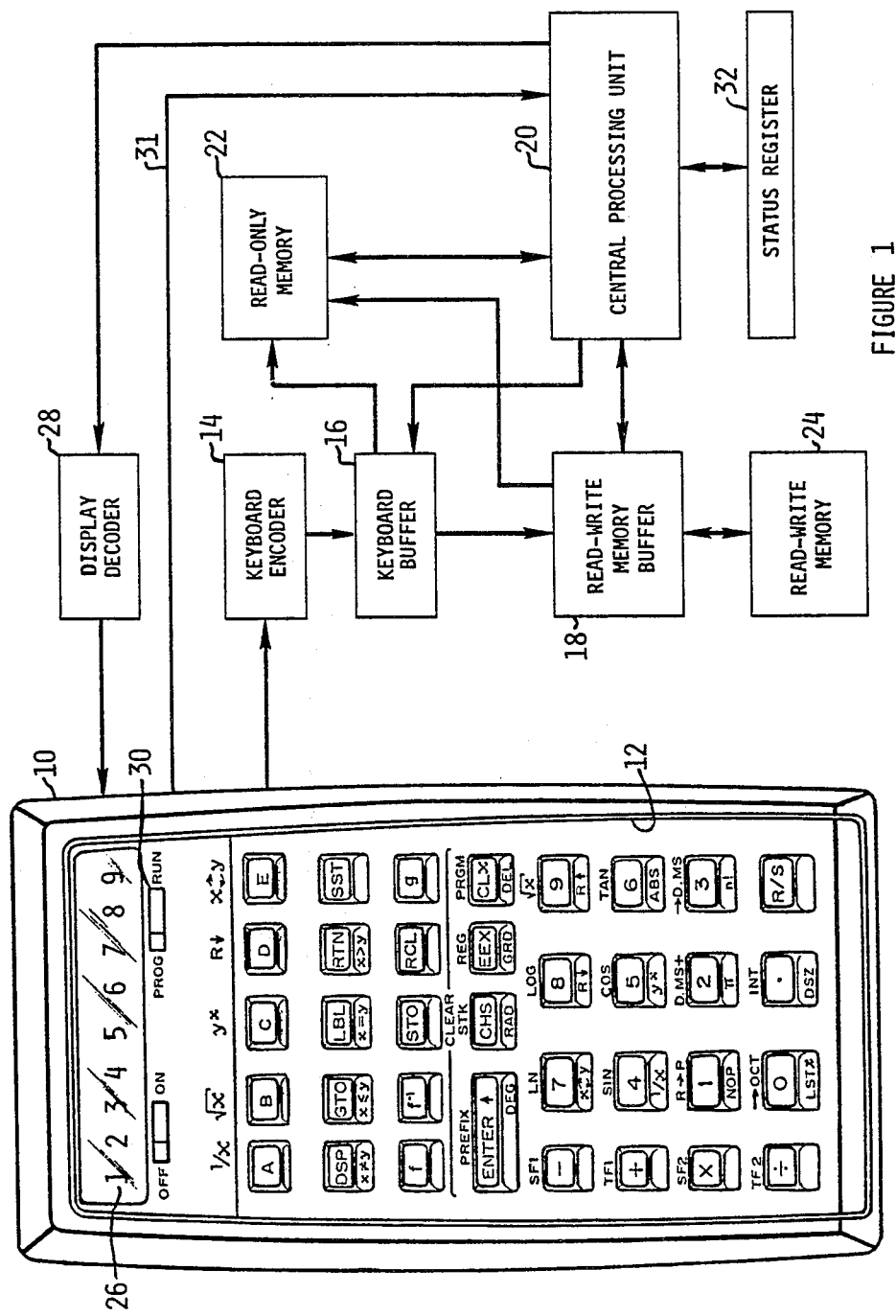
FIG. 1 shows a block diagram of a calculator according to the preferred embodiment.

FIG. 1 is a block diagram of a programmable, electronic calculator 10 having a keyboard 12 with keys for entering numbers and initiating the performance of various mathematical and manipulative operations. Keyboard 12 is connected to a keyboard encoder 14 which generates a binary code for each key that is depressed. Since keyboard 12 has 35 keys, a six-digit binary number is used to represent each of the keys. Illustrative examples of key codes, expressed in octal form, are shown in Table I. The keyboard and encoder may be implemented, for example, with an array of single-pole, single-throw switches, each switch being actuated by a key and being connected to a common diode encoding matrix or other well-known encoding structure. A keyboard buffer 16, connected to keyboard encoder 14, is a six binary digit (bit) shift register that stores the most recently generated key code. Key codes are subsequently transferred from the keyboard buffer to other elements in the calculator. A read-only memory (ROM) 22 contains instructions in binary form for the performance of the various calculator functions and these instructions are addressed or initiated by the binary key codes. Central processing unit (CPU) 20 performs the mathematical and control operations programmed in ROM 22. Results of keyboard entries as well as the manipulative operations performed by CPU 20 are displayed in a display 26 connected to CPU 20 by display decoder 28. The operation of such a ROM and CPU along with a keyboard display and associated components is described in detail in a patent application by France Rode, et al., entitled "Improved Business Calculator," Ser. No. 302,371 filed Oct. 30, 1972 and assigned to the assignee of the instant application, and also in the *Hewlett-Packard Journal*, June 1, 1972, pages 1 through 9.

Calculator 10 includes a read-write memory 24 that can store key codes from the keyboard, enabling the calculator to be programmed to perform mathematical and manipulative functions by storing key codes in the memory and initiating the recall of those stored key codes from the memory. Keyboard buffer 16 is connected to a read-write memory buffer 18, as well as CPU 20, and ROM 22, and the read-write memory buffer 18 is connected to read-write memory 24. The memory buffer 18 may also comprise a six-bit shift register, similar to keyboard buffer 16. Memory buffer 18 stores information which is to be transferred into or out of read-write memory 24. Calculator 10 is provided with a PROG/RUN switch 30 connected to CPU 20 by line 31 which enables the read-write memory to either store information from the keyboard or read out stored information to the CPU and ROM. When switch 30 is in the PROG or program position, execution of instructions corresponding to depressed keys is inhibited and the key codes are entered into the memory buffer 18 from keyboard buffer 16 and then into read-write memory 24. When switch 30 is placed in the RUN position, functions corresponding to the various keys will be executed when those keys are depressed. Programs stored in read-write memory 24 may be executed in Run mode by depressing a program initiation key.

In the illustrated embodiment, programs may be stored in the read-write memory and later initiated by actuating a Run/Stop key, R/S, or any one of the keys labeled A through E. The A–E keys facilitate the storage and recall of several different programs and subroutines in a single read-write memory. To store a program that will be recalled by depressing key A, the user switches PROG/RUN switch 30 to PROG, depresses the LBL key and then the A key. Next, the user actuates various keys on the keyboard in the order the functions are to be performed in the program. The last key in the program is RTN, which causes the calculator to return to the manual mode after the program has been executed and functions much as an END statement in a computer program. Further description of the components and operation of a programmable calculator, as described above, may be found in a U.S. Pat. No. 4,037,092 by Thomas E. Osborne, et al., entitled "Calculator Having Pre-Programmed User Definable Functions," filed Nov. 26, 1973, and assigned to the assignee of the instant application and in a U.S. Pat. No. 3,859,635 by Robert E. Watson, entitled "Improved Programmable Calculator," filed June 15, 1971, also assigned to the assignee of the instant application.

As previously mentioned, some of the functions performed by calculator 10 require the depression of a prefix key before the function can be initiated or programmed. For example, to take the logarithm (log) of a number, the "f" key must first be depressed and then the "8" key. These two key strokes will instruct the calculator to take the natural logarithm of a number already entered into the calculator. If only the "8" key were depressed, the number eight would be entered into the calculator rather than initiating the logarithm function. Similarly, to take the antilog of a number, the "f⁻¹" key is first depressed and then the "8" key is depressed. Similarly, the absolute value of a number may be determined by first depressing the "g" key followed by the "6" key. Two other prefix keys are also shown, STO and RCL, which are used for storing and recalling numerical constants. A number may be stored in any one of nine registers by entering the number and then pressing the STO key followed by one of the digits 1 through 9 to designate one of the nine storage registers. That same number may be recalled by depressing RCL followed by the digit key indicating the register in which the number is stored.

When a program is stored using any of the foregoing operations, two key codes must be stored: the prefix key code and the function key code. Thus, two positions in read-write memory 24 are used to store the instructions for a single operation. If a number of these functions are used in a program, a substantial amount of limited storage space will be used up with the prefix key codes. The amount of space used up by prefix key codes may be reduced by assigning some of the unused key codes (i.e., the key codes not assigned to the 35 keys on the keyboard) to a combination of a prefix key and a function key so that only a single position in read-write memory 24 is used to store the merged code for an instruction requiring two key strokes. These merged codes can be generated by checking each key code to see whether a prefix key has previously been depressed and, if it has, whether that key is one for which a merged code exists. If a merged code does exist, that code will be generated in response to an instruction from ROM 22 and will be inserted into memory 24 via CPU 20 in place of the prefix and function key codes. By way of example, Table I lists the functions, their key codes and corresponding merged codes (in octal form) used in the illustrated embodiment.

TABLE I

| Function | Key Codes Merged | Merged Code |
|---|---|---|
| STO 1 | 13 04 | 61 |
| STO 2 | 13 03 | 60 |
| STO 3 | 13 02 | 57 |
| STO 4 | 13 24 | 01 |
| STO 5 | 13 23 | 55 |
| STO 6 | 13 22 | 05 |
| STO 7 | 13 64 | 45 |
| STO 8 | 13 63 | 65 |
| RCL 1 | 12 04 | 41 |
| RCL 2 | 12 03 | 40 |
| RCL 3 | 12 02 | 37 |
| RCL 4 | 12 24 | 27 |
| RCL 5 | 12 23 | 35 |
| RCL 6 | 12 22 | 25 |
| RCL 7 | 12 64 | 20 |
| RCL 8 | 12 63 | 17 |
| g x ≠ y | 10 56 | 07 |
| g x ≦ y | 10 54 | 67 |
| g x = y | 10 53 | 31 |
| g x > y | 10 52 | 51 |
| g x ⇌ y | 10 64 | 21 |
| g R ↓ | 10 63 | 15 |
| g R ↑ | 10 62 | 11 |
| g NOP | 10 04 | 00 |
| g LSTX | 10 44 | 74 |

Figure 2:
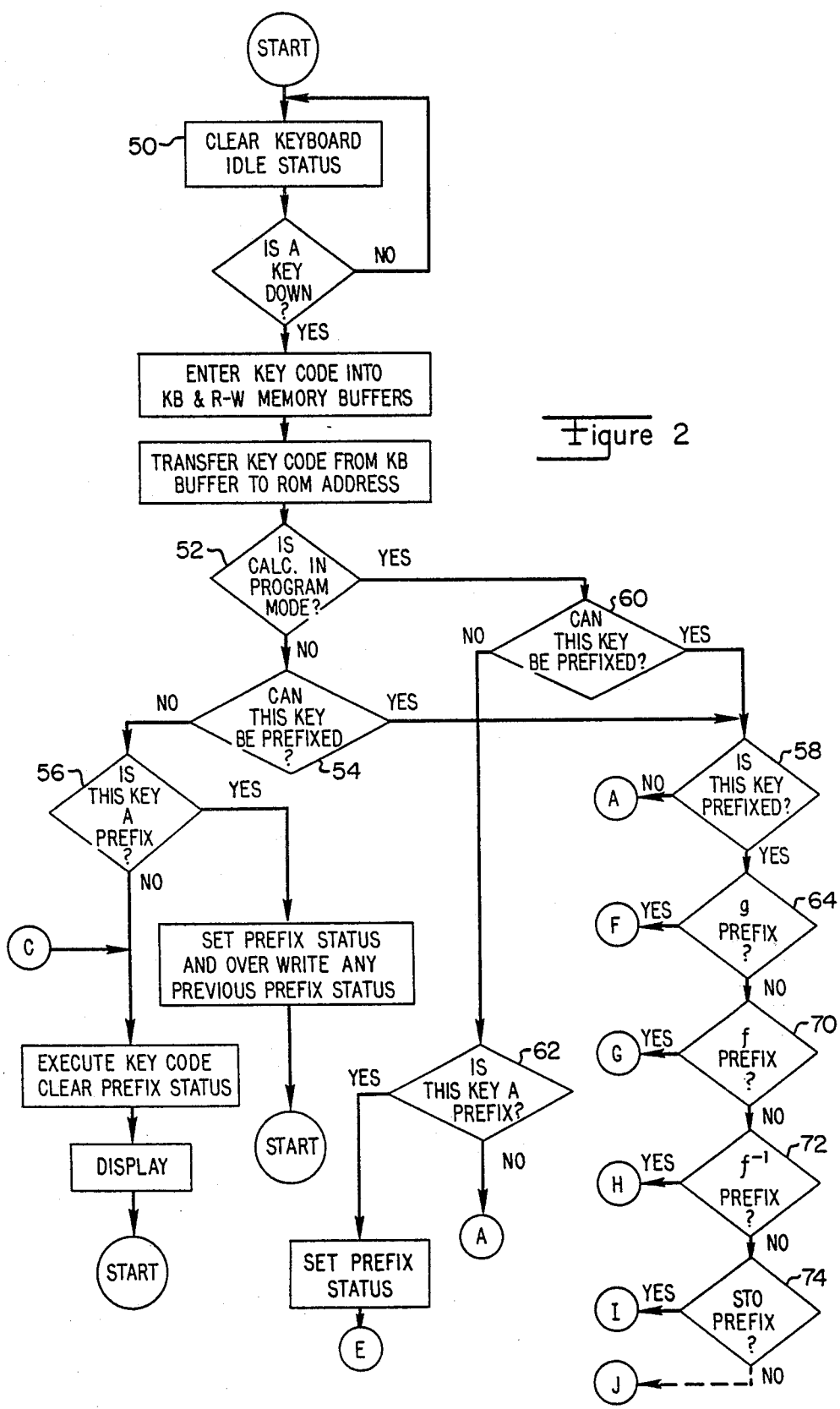
FIGS. 2 and 3 show a flow chart of the operation of the preferred embodiment.
Figure 3:
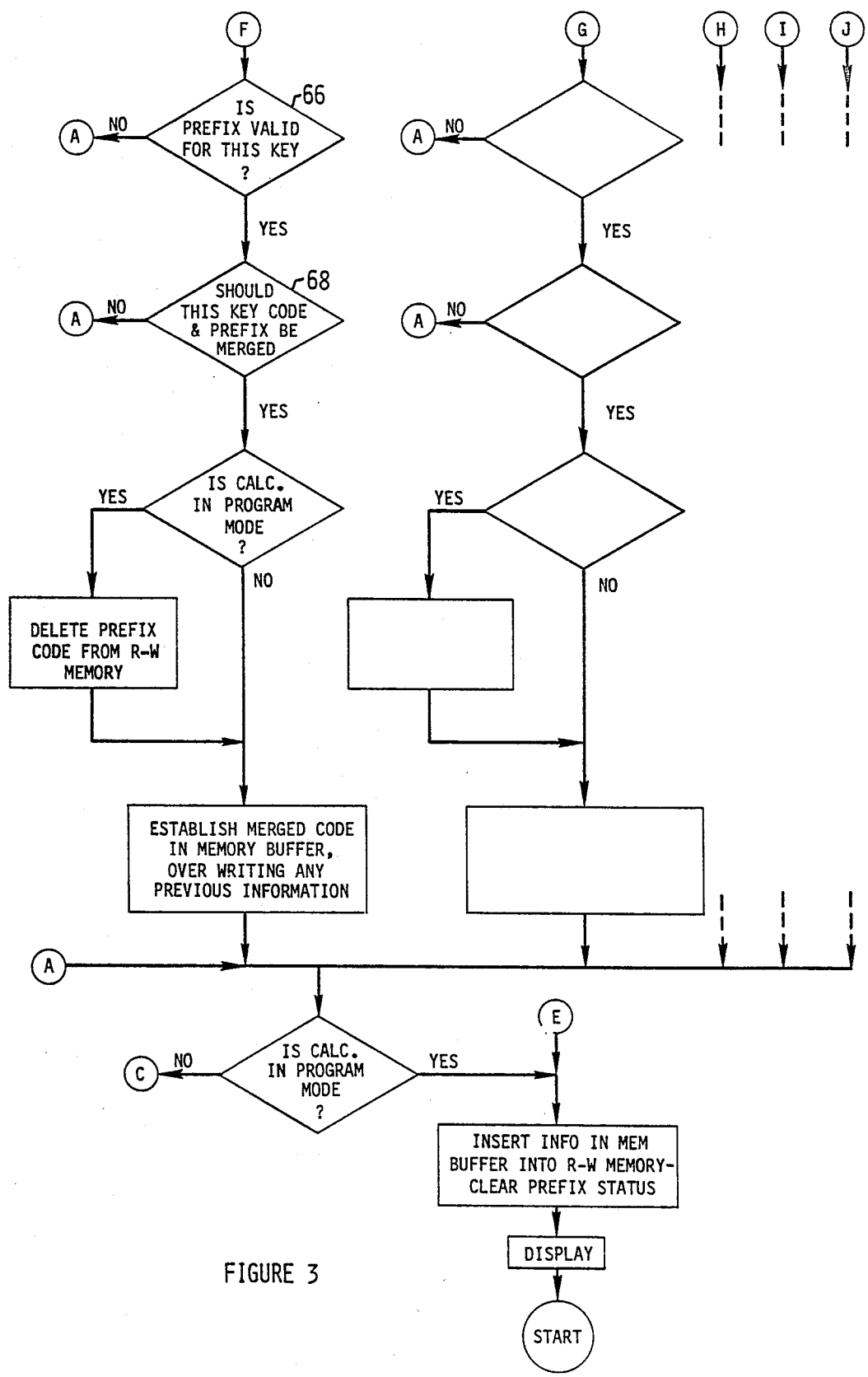

FIGS. 2 and 3 show a flow chart of the ROM program used to check for key codes to be merged and to generate the merged codes. Until a key is depressed, the calculator remains in an idle status, 50, and the keyboard is cleared. When a key is depressed, the key code is entered into the keyboard buffer 16 and the read-write memory buffer 18 and that key code is used to establish an address in ROM 22. That address location in ROM 22 initiates the program starting at decision block 52 in FIG. 2. If the calculator is not in the Program mode, that is, if it is in the Run mode, the calculator checks to see whether the key is one that can be prefixed. If the key cannot be prefixed, the calculator, then checks at block 56, to see if the key is a prefix. If it is not a prefix, the instruction corresponding to that key code is executed and the calculator then returns to the idle status. If the key is a prefix, then a prefix status is established in a status register 32 connected to CPU 20, overwriting any previously established prefix status.

The status register may be, for example, a five-bit shift register with one bit for each of the prefix keys. After the status is set, the calculator returns to the idle status awaiting the depression of another key.

If the key depressed can be validly prefixed, the calculator checks to see if the key is prefixed, at block 58. If this key has not been prefixed, then the instruction corresponding to the depressed key is executed. If the key has been prefixed, the merged code routine, described below, is initiated.

The previous paragraph discussed the operation of the calculator in the Run mode; if the calculator is in the Program mode, the calculator then checks whether the depressed key can be prefixed, at decision block 60. If the key cannot be prefixed, the calculator checks, at decision block 62, whether the depressed key is a prefix. If the key is a prefix, prefix status is set in status register 32. The key code in the memory buffer is inserted into the read-write memory and calculator returns to the idle status. if the key was not a prefix, then the instruction corresponding to that key is executed. If the key can be prefixed, decision block 58 interrogates whether the key is prefixed. If not prefixed, the key instruction is executed; if the key is prefixed, the calculator then checks for which prefix was assigned, as shown at decision blocks 64, 70, 72 and 74. The dashed lines in the figures indicate that any number of prefix keys could be checked for in the manner described below.

A "yes" answer from any of the decision blocks 64, 70, 72 or 74 initiates a branch to the flow chart in FIG. 3. For example, decision block 64 is a check for the "g" prefix. If the preceding key was a "g" prefix key, the calculator checks at block 66 to see if this prefix "g" is valid for the key which has just been depressed, since not all prefixes will necessarily apply to all keys. If the prefix is not valid for this key, the prefix status wil be cleared and the key code corresponding to the key depressed will be entered into the read-write memory. If the prefix is valid for this key, the calculator will check, at decision block 68, whether this is one of the key codes which should be merged with the prefix. If it is not, prefix status will be cleared and the key code will be entered into the read-write memory. If merger should take place, then the calculator once again checks for the Program mode. If the calculator is in the Program mode, the prefix key code is deleted from the read-write memory and then the merged code address is established in the read-write memory instead, overwriting any previous information. The merged code may be generated by the use of a look-up table in ROM 22 or through a numerical subroutine which generates a unique number in response to the prefix and function key codes being merged. If the calculator is not in the Program mode, the step deleting the prefix code from the read-write memory is skipped. The merged code is then transferred to ROM 22. If the calculator is not in the Program mode, the instruction corresponding to the key code will be executed. If the calculator is in the Program mode, the merged code is inserted into the read-write memory.

If the prefix that was previously established was not the "g" prefix, decision blocks 70, 72, 74, etc. will check for the other prefixes and will then perform the same checks of validity of the prefix and validity of merging for the particular combination of instruction and prefix.

As illustrated in FIG. 1 taken together with Table I, not all of the instructions requiring a prefix will necessarily generate merged codes, and those selected for merging are those that may be used more frequently in programming. The foregoing flow chart can be implemented in a read-only memory as shown in the program below in Table II as well as in equivalent hardware logic employing well-known techniques of logic design with gates and flip-flops. To assist the reader in understanding the operation of the program in Table II, the instructions used to generate a merged code for "x>y", requiring the depression of the "g" and "RTN" keys, are underlined. In addition, the corresponding decision blocks have been indicated by reference designator in the extreme right-hand column of the Table. The starting points of the ROM programs for the other keys are indicated by the key labels in the extreme right-hand column of the ROM 02 Object Program.

TABLE II

ROM00 OBJECT PROGRAM

```
 0   L00000    11.    .1.1   -> L0301      DUMMY  : JSB PW00
 1   L00001     .1.111.11   -> L0056       ST04   : GO TO ST04S
 2   L00002    . . . . . . . . . .                  NO OPERATION
 3   L00003    . . . . . . . . . .                  NO OPERATION
 4   L00004    1.1. 11.11   -> L0246              GO TO DEC?
 5   L00005     .1.11   11   -> L0054       ST06   : GO TO ST06S
 6   L00006    1111   11.1   -> L0363       TNX1   : JSB TNX2
 7   L00007    11.11. .1                    ST023  : A - 1 -> A[P]
 8   L00010    11.11 . 1                            A - 1 -> A[P]
 9   L00011.   11...1 1111   -> L0313              IF NO CARRY GO TO ST013
10   L00012    111....111    -> L0741              GO TO MIN20
11   L00013    . . . . . . . .                     NO OPERATION
12   L00014.   11.11  .1.                   RCL18  : A - 1 -> A[P]
13   L00015    .11.1...11    -> L0150              IF NO CARRY GO TO RCL19
14   L00016.   ...1.1.1 1    -> L0025              JSB RCL5
15   L00017.   ...11.1.11    -> L0032       RCL8   : GO TO RCL8S
16   L00020    ...11 1111    -> L0033       RCL7   : GO TO RCL7S
17   L00021.   1 11. .1.                    ST031  : C - 1 -> C[P] .
18   L00022    1......11     -> L0200              IF NO CARRY GO TO STC32
19   L00023.   1 11 11. 1    -> L0266              JSB CLRST
20   L00024.   111111..11    -> L0374              GO TO ST030
21   L00025.   ..111 .11     -> L0034       RCL6   : GO TO RCL6S
22   L00026.   1111 .111     -> L0171              GO TO NOSFX2
23   L00027.   .1111.11      -> L0036       RCL4   : GO TO RCL4S
```

| | | | | | |
|---|---|---|---|---|---|
| 24 | L00030: | 1.11111... | | LSTX2 : | DATA -> C |
| 25 | L00031: | 11.1.1.111 | -> L0325 | | GO TO FRTH11 |
| 26 | L00032: | 11111.1.1 | | RCL8S : | A + 1 -> A[X] |
| 27 | L00033: | 11111.1.1. | | RCL7S : | A + 1 -> A[X] |
| 28 | L00034: | 11111.1.1. | | RCL6S : | A + 1 -> A[X] |
| 29 | L00035: | 11111.1.1. | | RCL5 : | A + 1 -> A[X] |
| 30 | L00036: | 11111.1.1. | | RCL4S : | A + 1 -> A[X] |
| 31 | L00037: | 11111.1.1. | | RCL3 : | A + 1 -> A[X] |
| 32 | L00040: | 11111.1.1. | | RCL2 : | A + 1 -> A[X] |
| 33 | L00041: | 11111.1.1. | | RCL1 : | A + 1 -> A[X] |
| 34 | L00042: | .11.1.1.. | | | IF S3 # 1 |
| 35 | L00043: | 11.1.11111 | -> L0327 | | THEN GO TO RCL23 |
| 36 | L00044: | 111...111 | -> L0341 | | GO TO MIN20 |
| 37 | L00045: | ..1.1.1111 | -> L0053 | ST07 : | GO TO ST07S |
| 38 | L00046: | 1.....1.1. | | UFCN10: | IF S8 # 1 |
| 39 | L00047: | 1...111.11 | -> L0210 | | THEN GO TO UFCN11 |
| 40 | L00050: | 1...111111 | -> L0217 | | GO TO WAIT40 |
| 41 | L00051: | ......... | | | NO OPERATION |
| 42 | L00052: | 11111.1.1 | | ST08S : | A + 1 -> A[X] |
| 43 | L00053: | 11111.1.1 | | ST07S : | A + 1 -> A[X] |
| 44 | L00054: | 11111.1.1 | | ST06S : | A + 1 -> A[X] |
| 45 | L00055: | 11111.1.1 | | ST05 : | A + 1 -> A[X] |
| 46 | L00056: | 11111.1.1 | | ST04S : | A + 1 -> A[X] |
| 47 | L00057: | 11111.1.1 | | ST03 : | A + 1 -> A[X] |
| 48 | L00060: | 11111.1.1. | | ST02 : | A + 1 -> A[X] |
| 49 | L00061: | 11111.1.1. | | ST01 : | A + 1 -> A[X] |
| 50 | L00062: | ..11.1.1 | | | IF S3 # 1 |
| 51 | L00063: | 11.1...111 | -> L0321 | | THEN GO TO ST022 |
| 52 | L00064: | 111...111 | -> L0341 | | GO TO MIN20 |
| 53 | L00065: | ..1.1.1.11 | -> L0052 | ST08 : | GO TO ST08S |
| 54 | L00066: | 11.11...1. | | RCL25 : | A - 1 -> A[P] |
| 55 | L00067: | 11.11....1. | | | A - 1 -> A[P] |
| 56 | L00070: | 11111..11 | -> L0174 | | IF NO CARRY GO TO RCL12 |
| 57 | L00071: | 111....111 | -> L0341 | | GO TO MIN20 |
| 58 | L00072: | 11.11..1. | | ST018 : | A - 1 -> A[P] |
| 59 | L00073: | 1.11111.11 | -> L0276 | | IF NO CARRY GO TO ST019 |
| 60 | L00074: | .....1.1.1 | -> L0005 | | JSB ST06 |
| 61 | L00075: | ..11...11. | | LSTX0 : | 0 -> C[M] |
| 62 | L00076: | ..1.1.1... | | | C EXCHANGE M |
| 63 | L00077: | 1.111..1.. | | | 0 -> S11 |
| 64 | L00100: | ...111.... | | | 0 -> F1 |
| 65 | L00101: | 1.11.1.1. | | | IF S11 # 1 |
| 66 | L00102: | .1...1..11 | -> L0104 | | THEN GO TO LSTX1 |
| 67 | L00103: | .1..1.1... | | | C -> STACK |
| 68 | L00104: | ..11..111. | | LSTX1 : | 0 -> C[W] |
| 69 | L00105: | 1..111.... | | | C -> DATA ADDRESS |
| 70 | L00106: | ...11...11 | -> L0030 | | GO TO LSTX2 |
| 71 | L00107: | 11.11...1. | | RCL14 : | A - 1 -> A[P] |
| 72 | L00110: | .1..1.1.11 | -> L0112 | | IF NO CARRY GO TO RCL15 |
| 73 | L00111: | ..1......1 | -> L0040 | | JSB RCL2 |
| 74 | L00112: | 11.11..1. | | RCL15 : | A - 1 -> A[P] |
| 75 | L00113: | 111111.111 | -> L0375 | | IF NO CARRY GO TO RCL16 |
| 76 | L00114: | ...11111.1 | -> L0037 | | JSB RCL3 |
| 77 | L00115: | .....11.11 | -> L0006 | | GO TO TNX1 |
| 78 | L00116: | .1.1..11.. | | SDGT2 : | 5 -> P |
| 79 | L00117: | .11.1....1. | | | IF C[P] = 0 |
| 80 | L00120: | 1....11.11 | -> L0206 | | THEN GO TO SDGT3 |
| 81 | L00121: | .1.11....1. | | | C - 1 -> C[P] |
| 82 | L00122: | .11.1....1. | | | IF C[P] = 0 |
| 83 | L00123: | .11.1.1111 | -> L0153 | | THEN GO TO ST011 |
| 84 | L00124: | .1.11...1. | | | C - 1 -> C[P] |
| 85 | L00125: | ..1...11.. | | | 2 -> P |
| 86 | L00126: | .111.1..1 | -> L0164 | | JSB ADRS3 |
| 87 | L00127: | 1111.11111 | -> L0367 | | GO TO ST010 |
| 88 | L00130: | ....1.111. | | ADRS4 : | 0 -> B[W] |
| 89 | L00131: | .1....111. | | ADRS1 : | SHIFT LEFT A[W] |
| 90 | L00132: | ....1111.. | | | P + 1 -> P |
| 91 | L00133: | 11..1...1. | | | IF P # 12 |
| 92 | L00134: | .1.11..111 | -> L0131 | | THEN GO TO ADRS1 |
| 93 | L00135: | 111.1.111. | | | A EXCHANGE C[W] |
| 94 | L00136: | 1..111.... | | | C -> DATA ADDRESS |
| 95 | L00137: | 111.1.111. | | | A EXCHANGE C[W] |

```
 96  L00140:  ....11....
 97  L00141:  11.11....1.
 98  L00142:  ....11..11   -> L0014
 99  L00143:  ...111.1.1   -> L0035
100  L00144:  1.....1....  -> L4145
101  L00145:  11.11....1.
102  L00146:  111.1...11   -> L0350
103  L00147:  ...1.1111.1  -> L0057
104  L00150:  11.11....1.
105  L00151:  1.....1.111  -> L0205
106  L00152:  ....1......1 -> L0020
107  L00153:  1...1.1...1  -> L0212
108  L00154:  ..11.1.1..
109  L00155:  11.1..1111   -> L0323
110  L00156:  11111....1.
111  L00157:  .....11111   -> L0007
112  L00160:  111......1   -> L0341
113  L00161:  11.11....1.
114  L00162:  .11..1.111   -> L0145
115  L00163:  ..11......1  -> L0060
116  L00164:  .1......1..
117  L00165:  1..1111.1.
118  L00166:  .1.11...11   -> L0130
119  L00167:  .1...1.1..
120  L00170:  .1111.1111   -> L0173
121  L00171:  1...1.1..1   -> L0212
122  L00172:  11111.....
123  L00173:  .1...1....   -> L2174
124  L00174:  1...1......1 -> L0220
125  L00175:  11.11....1.
126  L00176:  .1...11111   -> L0107
127  L00177:  ..1.....1.1  -> L0041
128  L00200:  .1.11....1.
129  L00201:  11..111111   -> L0317
130  L00202:  1.11.11..1   -> L0266
131  L00203:  1.1..1....1  -> L0244
132  L00204:  1.1...1111   -> L0243
133  L00205:  ....1111.1   -> L0017
134  L00206:  ..11.1.1..
135  L00207:  .11..1..11   -> L0144
136  L00210:  1.1.1....1   -> L5211
137  L00211:  .11..1....   -> L3212
138  L00212:  ..11...11.
139  L00213:  ..1.1.1...
140  L00214:  ..1...11..
141  L00215:  ....11....
142  L00216:  1.1.....1..
143  L00217:  ..1..1....   -> L1220
144  L00220:  111.1.....
145  L00221:  .11.......
146  L00222:  1.111....1.
147  L00223:  1.111.....
148  L00224:  1.11.1.1..
149  L00225:  1..1..1111   -> L0223
150  L00226:  1.111.....
151  L00227:  ....11....
152  L00230:  .1....11..
153  L00231:  .11.111..
154  L00232:  .1.111.11    -> L0116
155  L00233:  1...1.1..1   -> L0212
156  L00234:  ..11.1.1..
157  L00235:  11.11..111   -> L0331
158  L00236:  11111....1.
159  L00237:  ..11.11.11   -> L0066
160  L00240:  111....111   -> L0341
161  L00241:  ..11.1.1.1   -> L0065
162  L00242:  11.1.1.111   -> L0325
163  L00243:  .11....111.
164  L00244:  11...1....   -> L6245
165  L00245:  11...1....   -> L6246
166  L00246:  11....11..
```

RETURN
RCL17 :  A - 1 -> A[P]
         IF NO CARRY GO TO RCL18
         JSB RCL5
***** SDGT4 : SELECT ROM 4
STO15 :  A - 1 -> A[P]
         IF NO CARRY GO TO STO16
         JSB STO3
RCL19 :  A - 1 -> A[P]
         IF NO CARRY GO TO RCL20
         JSB RCL7
STO11 :  JSB CLRM
         IF S3 # 1
             THEN GO TO STO12
         A + 1 -> A[P]
         IF NO CARRY GO TO STO23
         GO TO MIN20
STO14 :  A - 1 -> A[P]
         IF NO CARRY GO TO STO15
         JSB STO2
ADRS3 :  1 -> S4
ADRS0 :  IF A[XS] >= 1
             THEN GO TO ADRS4
         IF S4 # 1
             THEN GO TO NOSFX1
NOSFX2:  JSB CLRM
NOSFX3:  0 -> F7
***** NOSFX1:  SELECT ROM 2
RCL12 :  JSB MDL0
         A - 1 -> A[P]
         IF NO CARRY GO TO RCL14
         JSB RCL1
STO32 :  C - 1 -> C[P]
         IF NO CARRY GO TO STO36
         JSB CLRST
         JSB MPY20
         GO TO SQX1
RCL20 :  JSB RCL8
SDGT3 :  IF S3 # 1
             THEN GO TO SDGT4
***** SELECT ROM 5
***** FACT0 :  SELECT ROM 3
CLRM  :  0 -> C[M]
         C EXCHANGE M
         2 -> P
         RETURN
UFCH11:  1 -> S10
***** WAIT40: SELECT ROM 1
MDL0  :  1 -> F7
         MEMORY DELETE
         0 -> S11
MDL1  :  0 -> F5
         IF S11 # 1
             THEN GO TO MDL1
         0 -> F5
         RETURN
SDGT1 :  4 -> P
         IF C[P] = 0
             THEN GO TO SDGT2
RCL10 :  JSB CLRM
         IF S3 # 1
             THEN GO TO RCL11
         A + 1 -> A[P]
         IF NO CARRY GO TO RCL25
         GO TO MIN20
STO20 :  JSB STO8
         GO TO FRTN11
SQX1  :  C -> A[W]
***** MPY20 : SELECT ROM 6
***** DVD20 : SELECT ROM 6
DEC7  :  12 -> P

| # | Label | Bits | Jump | Marker | Symbol | Instruction |
|---|---|---|---|---|---|---|
| 167 | L00247: | .11.1...1. | | | | IF C[P] = 0 |
| 168 | L00250: | .1111..111 | -> L0171 | | | THEN GO TO NOSFX2 |
| 169 | L00251: | ..1..11... | | | | LOAD CONSTANT 2 |
| 170 | L00252: | ...1.1.1.. | | | | C EXCHANGE M |
| 171 | L00253: | 1...111111 | -> L0217 | | | GO TO WAIT40 |
| 172 | L00254: | .1......11 | | | FRAC2 : | SHIFT LEFT A[M] |
| 173 | L00255: | 11.11.1.1. | | | | A - 1 -> A[X] |
| 174 | L00256: | .....1111.. | | | | P + 1 -> P |
| 175 | L00257: | 11..1.11.. | | | FRAC1 : | IF P # 12 |
| 176 | L00260: | 1.1.11..11 | -> L0254 | | | THEN GO TO FRAC2 |
| 177 | L00261: | 111.1.111. | | | | A EXCHANGE C[W] |
| 178 | L00262: | .11...111. | | | | C -> A[W] |
| 179 | L00263: | 1.111.1.1. | | | | 0 -> A[X] |
| 180 | L00264: | 1.1.11.1.. | | ***** | | DELAYED SELECT GROUP 1 |
| 181 | L00265: | .11..1.111 | -> L0145 | | | GO TO 0145 |
| 182 | L00266: | ..11...11. | | | CLRST : | 0 -> C[M] |
| 183 | L00267: | ..1.1.1... | | | | C EXCHANGE M |
| 184 | L00270: | 11.....11.. | | | | 12 -> P |
| 185 | L00271: | .11...111. | | | CLRST1: | C -> A[W] |
| 186 | L00272: | 1.11111... | | | | DATA -> C |
| 187 | L00273: | 111.1.111. | | | | A EXCHANGE C[W] |
| 188 | L00274: | 1.1111.... | | | | C -> DATA |
| 189 | L00275: | .....11.... | | | | RETURN |
| 190 | L00276: | 11.11..... | | | STO19 : | A - 1 -> A[P] |
| 191 | L00277: | 1.1.....111 | -> L0241 | | | IF NO CARRY GO TO STO20 |
| 192 | L00300: | ..1...1.1.1 | -> L0045 | | | JSB STO7 |
| 193 | L00301: | 1.1.11..1.. | | ***** | PWO0 : | DELAYED SELECT GROUP 1 |
| 194 | L00302: | .1....1.... | -> L2303 | ***** | | SELECT ROM 2 |
| 195 | L00303: | .......... | | | | NO OPERATION |
| 196 | L00304: | .......... | | | | NO OPERATION |
| 197 | L00305: | 11.1111.1. | | | GDGT2 : | A - 1 -> A[XS] |
| 198 | L00306: | 11..1...11 | -> L0310 | | | IF NO CARRY GO TO GDGT3 |
| 199 | L00307: | 1....1..111 | -> L0211 | | | GO TO FACT0 |
| 200 | L00310: | 1.1..1..... | -> L5311 | ***** | GDGT3 : | SELECT ROM 5 |
| 201 | L00311: | 1.1.111111 | -> L0257 | | | GO TO FRAC1 |
| 202 | L00312: | .1111..111 | -> L0171 | | | GO TO NOSFX2 |
| 203 | L00313: | 1..1.....1 | -> L0220 | | STO13 : | JSB MDL0 |
| 204 | L00314: | 11.11...1. | | | | A - 1 -> A[P] |
| 205 | L00315: | .111...111 | -> L0161 | | | IF NO CARRY GO TO STO14 |
| 206 | L00316: | ..11....1.1 | -> L0061 | | | JSB STO1 |
| 207 | L00317: | 1.11.11..1 | -> L0266 | | STO36 : | JSB CLRST |
| 208 | L00320: | 1.1..11..1 | -> L0245 | | | JSB DVD20 |
| 209 | L00321: | 1...1..1.1 | -> L0212 | | STO22 : | JSB CLRM |
| 210 | L00322: | ......11.. | | | | 0 -> P |
| 211 | L00323: | .111.1.1.1 | -> L0165 | | STO12 : | JSB ADRS0 |
| 212 | L00324: | 1.1111.... | | | | C -> DATA |
| 213 | L00325: | .1...1.... | -> L2326 | ***** | FRTN11: | SELECT ROM 2 |
| 214 | L00326: | .1...1.... | -> L2327 | ***** | FRTN10: | SELECT ROM 2 |
| 215 | L00327: | 1...1.1..1 | -> L0212 | | RCL23 : | JSB CLRM |
| 216 | L00330: | ......11.. | | | | 0 -> P |
| 217 | L00331: | .111.1.1.1 | -> L0165 | | RCL11 : | JSB ADRS0 |
| 218 | L00332: | 1.111..1.. | | | | 0 -> S11 |
| 219 | L00333: | ..111..... | | | | 0 -> F1 |
| 220 | L00334: | 1.11.1.1.. | | | | IF S11 # 1 |
| 221 | L00335: | 11.1111111 | -> L0337 | | | THEN GO TO RCL22 |
| 222 | L00336: | .1..1.1... | | | | C -> STACK |
| 223 | L00337: | 1.11111... | | | RCL22 : | DATA -> C |
| 224 | L00340: | 11.1.1.111 | -> L0325 | | | GO TO FRTN11 |
| 225 | L00341: | 1....1.... | -> L4342 | ***** | MIN20 : | SELECT ROM 4 |
| 226 | L00342: | 1.111..1.1 | -> L0271 | | | JSB CLRST1 |
| 227 | L00343: | 111.1.111. | | | | A EXCHANGE C[W] |
| 228 | L00344: | 1...111111 | -> L0217 | | | GO TO WAIT40 |
| 229 | L00345: | .......... | | | | NO OPERATION |
| 230 | L00346: | .......... | | | | NO OPERATION |
| 231 | L00347: | .......... | | | | NO OPERATION |
| 232 | L00350: | 11.11...1. | | | STO16 : | A - 1 -> A[P] |
| 233 | L00351: | 111.11..11 | -> L0354 | | | IF NO CARRY GO TO STO17 |
| 234 | L00352: | ........1.1 | -> L0001 | | | JSB STO4 |
| 235 | L00353: | .1111..111 | -> L0171 | | | GO TO NOSFX2 |
| 236 | L00354: | 11.11....1 | | | STO17 : | A - 1 -> A[P] |
| 237 | L00355: | ..111..1.11 | -> L0072 | | | IF NO CARRY GO TO STO18 |

```
238  L00356:  ..1.11.1.1  -> L0055              JSB ST05
239  L00357:  ..........                        NO OPERATION
240  L00360:  ..........                        NO OPERATION
241  L00361:  ...1......                        BUFFER -> ROM ADDRESS
242  L00362:  ........11  -> L0000              GO TO DUMMY
243  L00363:  ..1....1..              TNX2  :   1 -> S2
244  L00364:  .11...111.                        C -> A[W]
245  L00365:  111..1....  -> L7366    *****     SELECT ROM 7
246  L00366:  ..........                        NO OPERATION
247  L00367:  .1.1..11..              ST010 :   5 -> P
248  L00370:  .1.11...1.                        C - 1 -> C[P]
249  L00371:  ...1...111  -> L0021              IF NO CARRY GO TO ST031
250  L00372:  1.11.11..1  -> L0266              JSB CLRST
251  L00373:  ..1111111.                        0 - C - 1 -> C[S]
252  L00374:  1.1..1....  -> L5375    *****  ST030 :  SELECT ROM 5
253  L00375:  11.11....1              RCL16 :   A - 1 -> A[P]
254  L00376:  .11....111  -> L0141              IF NO CARRY GO TO RCL17
255  L00377:  ...1.111.1  -> L0027              JSB RCL4

ROM01 OBJECT PROGRAM

0  L01000:  .11...11..
  1  L01001:  ...11...1.
  2  L01002:  ..11.11.11  -> L1066              DEC6  :  6 -> P
  3  L01003:  ..........  -> L0004    *****              IF C[P] >= 1
  4  L01004:  1.....1...  -> L4005    *****                   THEN GO TO DEC3
  5  L01005:  1111111.1.                                  SELECT ROM 0
  6  L01006:  1...11.111  -> L1215              DSZ6  :  SELECT ROM 4
  7  L01007:  1.1.11.1..              *****     FDGT8 :  A + 1 -> A[XS]
  8  L01010:  ..1...1...  -> L1011    *****              IF NO CARRY GO TO DOCT0
  9  L01011:  1...11..11.                                 DELAYED SELECT GROUP 1
 10  L01012:  .1..1.1111  -> L1113                        SELECT ROM 1
 11  L01013:  .1..111111  -> L1117              DSZ5  :  IF A[M] >= 1
 12  L01014:  .11.1..11.                                  THEN GO TO DSZ10
 13  L01015:  .111.1..11  -> L1164                        GO TO DSZ7
 14  L01016:  1.1..11...              ENTR2 :   IF C[M] = 0
 15  L01017:  .1...1....  -> L2020    #####              THEN GO TO ENTR1
 16  L01020:  ..........              *****              DELAYED SELECT GROUP 1
 17  L01021:  1.1111.1.1  -> L1275                        SELECT ROM 2
 18  L01022:  111.111.11  -> L1356                        NO OPERATION
 19  L01023:  .11.1..11.                                  JSB WAIT3
 20  L01024:  ...11..111  -> L1031                        GO TO WAIT40
 21  L01025:  1..1....11              DSZ3  :  IF C[M] = 0
 22  L01026:  .1.11.1.1.                                  THEN GO TO DSZ4
 23  L01027:  ...11.1.1.                                 SHIFT RIGHT C[M]
 24  L01030:  ...1..1111  -> L1023                        C - 1 -> C[X]
 25  L01031:  ..111111..              DSZ2  :  IF C[X] >= 1
 26  L01032:  1.11.1..11  -> L1264                        THEN GO TO DSZ3
 27  L01033:  11.1....11              DSZ4  :  IF C[S] >= 1
 28  L01034:  ....1..111  -> L1011                        THEN GO TO DSZ13
 29  L01035:  ..1111111.                                  A - C -> A[M]
 30  L01036:  1.1111....                                  IF NO CARRY GO TO DSZ5
 31  L01037:  1...1.111.                                  0 - C - 1 -> C[S]
 32  L01040:  1..111...1  -> L1234              DSZ8  :  C -> DATA
 33  L01041:  1.111..1..                                 B EXCHANGE C[W]
 34  L01042:  ....11....                                 JSB DSZ12
 35  L01043:  1.11.1.1..              WAIT30:  0 -> S11
 36  L01044:  1..1....11  -> L1220                       0 -> F0
 37  L01045:  1.1.11.1..              #####              IF S11 # 1
 38  L01046:  ...1..1...  -> L1047    *****              THEN GO TO WAIT10
 39  L01047:  ..........                                 DELAYED SELECT GROUP 1
 40  L01050:  ....11..11  -> L1014                       SELECT ROM 1
 41  L01051:  .111111.1.                                 NO OPERATION
 42  L01052:  1.1..1.1..              WAIT11:  GO TO ENTR2
 43  L01053:  .1.1.1.1..              WAIT4 :  C + 1 -> C[XS]
 44  L01054:  111.1..11  -> L1350                        0 -> S10
 45  L01055:  .1111.1.1.                                 IF S5 # 1
 46  L01056:  ..1.1.111  -> L1051                        THEN GO TO WAIT13
 47  L01057:  11.11.1.11  -> L1332                       C + 1 -> C[X]
 48  L01060:  .11.....1.                                 IF NO CARRY GO TO WAIT11
 49  L01061:  111.1.111.                                 GO TO WAIT17
 50  L01062:  .11..1....  -> L3063    *****    PTR5  :  1 -> S6
                                                         A EXCHANGE C[W]
                                                         SELECT ROM 3
```

```
51  L01063:  .....111..
52  L01064:  .1111.1.1.
53  L01065:  ..111.11.1  -> L1073
54  L01066:  1.1..1....  -> L5067    *****
55  L01067:  ..........
56  L01070:  .11.11.1.
57  L01071:  11.1..11..
58  L01072:  .1.11.1.1.
59  L01073:  .........1.
60  L01074:  ..11..1111  -> L1063
61  L01075:  11.....11..
62  L01076:  1..11....1.
63  L01077:  .11111..11  -> L1174
64  L01100:  .1.....11.
65  L01101:  .1.11.1.1.
66  L01102:  ..11111..1  -> L1076
67  L01103:  .1....1.1.
68  L01104:  .111.11.11  -> L1166
69  L01105:  1.1.1.111.
70  L01106:  .111.1111.
71  L01107:  1..11..11.
72  L01110:  1.11.11111  -> L1267
73  L01111:  ..1111111.
74  L01112:  1.11.111.1  -> L1267
75  L01113:  1..11...1.
76  L01114:  .1..111111  -> L1117
77  L01115:  .1....11..
78  L01116:  11.11.1.1.
79  L01117:  111.1.111.
80  L01120:  ...1111..1  -> L1036
81  L01121:  11111...1.
82  L01122:  11111.1.1.
83  L01123:  .1..1111.1  -> L1117
84  L01124:  .111.11..
85  L01125:  .11.1...1.
86  L01126:  ........11  -> L1000
87  L01127:  1.1..1....  -> L5130   *****
88  L01130:  11.1111111  -> L1337
89  L01131:  ..111..1..
90  L01132:  .1..1.....
91  L01133:  ...1..11..
92  L01134:  ..1.1.1...
93  L01135:  1.111.1...
94  L01136:  .1111.....
95  L01137:  ..11.1.1..
96  L01140:  .11.1.1.11  -> L1152
97  L01141:  1.11.1.1..
98  L01142:  11.1...111  -> L1321
99  L01143:  ..1.1.1...
100 L01144:  1.1.11.1..            #####
101 L01145:  .11..1....  -> L3146  *****
102 L01146:  .111111.1.
103 L01147:  ..111...11  -> L1070
104 L01150:  ..1.1..1..
105 L01151:  ..111..1.1  -> L1071
106 L01152:  1.11.1.1..
107 L01153:  1111.1..11  -> L1364
108 L01154:  .11.1...1.
109 L01155:  1...111.11  -> L1216
110 L01156:  .1.11...1.
111 L01157:  .11.1...1.
112 L01160:  1...111.11  -> L1216
113 L01161:  ..1.1.11..
114 L01162:  1.1.11.1..           #####
115 L01163:  .....1....  -> L0164  *****
116 L01164:  .1.111.1..           $$$$$
117 L01165:  .1....1111  -> L1103
118 L01166:  .11..1....  -> L3167  *****
119 L01167:  .111.1.111.
120 L01170:  .11...111.
121 L01171:  1..11..11..
```

```
FIX5   , P - 1 -> P
         C + 1 -> C[X]
         JSB FIX7
DEC8 ,   SELECT ROM 5
         NO OPERATION
FIX3 ,   0 -> C[XS]
FIX4 ,   13 -> P
         C - 1 -> C[X]
FIX7 ,   IF E[P] = 0
            THEN GO TO FIX5
         12 -> P
FIX6 ,   IF A[P] >= 1
            THEN GO TO FIX2
         SHIFT LEFT A[M]
         C - 1 -> C[X]
         JSB FIX6
RTP3 ,   IF S4 # 1
            THEN GO TO RTP4
         C + C -> C[W]
         A + C -> C[S]
         IF A[M] >= 1
            THEN GO TO RTP5
         0 - C - 1 -> C[S]
         JSB RTP5
DSZ10 ,  IF A[P] >= 1
            THEN GO TO DSZ7
         SHIFT LEFT A[M]
         A - 1 -> A[X] .
DSZ7 ,   A EXCHANGE C[W]
         JSB DSZ8
DSZ11 ,  A + 1 -> A[P]
         A + 1 -> A[X]
         JSB DSZ7
DEC5 ,   7 -> P
         IF C[P] = 0
            THEN GO TO DEC6
         SELECT ROM 5
         GO TO WAIT29
WAIT16:  0 -> S3
         1 -> F2
         1 -> P
         C EXCHANGE M
         0 -> S11
         0 -> F3
         IF S3 # 1
            THEN GO TO WAIT2
         IF S11 # 1
            THEN GO TO WAIT33
WAIT36:  C EXCHANGE M
         DELAYED SELECT GROUP 1
         SELECT ROM 3
FIX1 ,   C + 1 -> C[XS]
         IF NO CARRY GO TO FIX3
         0 - C -> C[X]
         JSB FIX4
WAIT2 ,  IF S11 # 1
            THEN GO TO WAIT35
         IF C[P] = 0
            THEN GO TO DSCI50
         C - 1 -> C[P]
         IF C[P] = 0
            THEN GO TO DSCI50
WAIT39,  LOAD CONSTANT 2
         DELAYED SELECT GROUP 1
         SELECT ROM 0
ENTR1 ,  DELAYED SELECT ROM 2
         GO TO @103
RTP4 ,   SELECT ROM 3
FIX0 ,   A EXCHANGE C[W]
         C -> A[W]
         IF A[M] >= 1
```

```
122  L01172:  .11..11.11  -> L1146                        THEN GO TO FIX1
123  L01173:  1.111..11.                                  0 -> A[M]
124  L01174:  111.1..11.              FIX2  ,  A EXCHANGE C[M]
125  L01175:  .1...1....  -> L2176    *****  FRTH5 ,  SELECT ROM 2
126  L01176:  1.1111.1.1  -> L1275                        JSB WAIT3
127  L01177:  ..11.1.1..                                  IF S3 # 1
128  L01200:  1111..1111  -> L1363                          THEN GO TO WAIT32
129  L01201:  1.....1...  -> L4202    *****           SELECT ROM 4
130  L01202:  1111111.1.              FIDGT8 , A + 1 -> A[XS]
131  L01203:  11...1.111  -> L1305                      IF NO CARRY GO TO ODEC0
132  L01204:  .11.1.1...              PTR0   , STACK -> A
133  L01205:  ...1...1..                                  1 -> S1
134  L01206:  .1.....1..                                  1 -> S4
135  L01207:  .1.1...1..                                  1 -> S5
136  L01210:  ..11....11  -> L1060                        GO TO PTR5
137  L01211:  ..11...11.              WAIT44 , 0 -> C[M]
138  L01212:  .111...1.1  -> L1161                        JSB WAIT39
139  L01213:  ..........                                  NO OPERATION
140  L01214:  ..........                                  NO OPERATION
141  L01215:  .11..1....  -> L3216    *****  DOCT0  , SELECT ROM 3
142  L01216:  1.1.11.1..              *****  DSCI50 , DELAYED SELECT-GROUP 1
143  L01217:  .....1....  -> L0220    *****           SELECT ROM 0
144  L01220:  1.....1.1..             WAIT10 , IF S8 # 1
145  L01221:  .1.11..111  -> L1131                        THEN GO TO WAIT16
146  L01222:  11.....11..             WAIT1  , 12 -> P
147  L01223:  ......1.1..                                 IF S0 # 1
148  L01224:  ..1.1.1.11  -> L1052                        THEN GO TO WAIT4 START
149  L01225:  ....1111..              WAIT31 , P + 1 -> P
150  L01226:  11..1.11..                                  IF P # 12
151  L01227:  1..1.1.111  -> L1225                        THEN GO TO WAIT31
152  L01230:  ....1..1..                                  0 -> S0
153  L01231:  1.1..1.1..                                  IF S10 # 1
154  L01232:  1.1....111  -> L1241                        THEN GO TO WAIT28
155  L01233:  1..1..1.11  -> L1222                        GO TO WAIT1 START
156  L01234:  ..1.1.1...              DSZ12  , C EXCHANGE M
157  L01235:  .......11.                                  IF B[M] = 0
158  L01236:  ......1.11  -> L1004                        THEN GO TO DSZ6
159  L01237:  .1...1....  -> L2240    *****  DSZ9   , SELECT ROM 2
160  L01240:  .....1....  -> L0241    *****  DEC7   , SELECT ROM 0
161  L01241:  .1.1.1.1..              WAIT28 , IF S5 # 1
162  L01242:  11.111..11  -> L1334                        THEN GO TO WAIT6
163  L01243:  11.1111111  -> L1337                        GO TO WAIT29
164  L01244:  11...1....  -> L6245    *****  MPY20  , SELECT ROM 6
165  L01245:  11....1...  -> L6246    *****  DVD20  , SELECT ROM 6
166  L01246:  ..........                                  NO OPERATION
167  L01247:  1.1..1.111  -> L1245                        GO TO DVD20
168  L01250:  1...1.111.              DSZ0   , B EXCHANGE C[W]
169  L01251:  ..11..111.                                  0 -> C[W]
170  L01252:  11.....11..                                 12 -> P
171  L01253:  .1.11...1.                                  C - 1 -> C[P]
172  L01254:  .1.11...1.                                  C - 1 -> C[P]
173  L01255:  1..111....                                  C -> DATA ADDRESS
174  L01256:  ....1..11.                                  C -> C[M]
175  L01257:  1.11111...                                  DATA -> C
176  L01260:  .11...111.              DSZ1   , C -> A[W]
177  L01261:  ..11...11.                                  0 -> C[M]
178  L01262:  .1111...1.                                  C + 1 -> C[P]
179  L01263:  ...1.111.1  -> L1027                        JSB DSZ2
180  L01264:  1111...11.              DSZ13  , A + C -> A[M]
181  L01265:  .1.111111.  -> L1117                        IF NO CARRY GO TO DSZ7
182  L01266:  .1.1...111  -> L1121                        GO TO DSZ11
183  L01267:  ...11..1..              RTP5   , 0 -> S1
184  L01270:  .11..1....  -> L3271    *****          SELECT ROM 3
185  L01271:  ...11..11..                                 3 -> P
186  L01272:  ...11...1.                                  IF C[P] >= 1
187  L01273:  1.1.1...11  -> L1250                        THEN GO TO DSZ0
188  L01274:  1.1.1...11  -> L1124                        GO TO DEC5
189  L01275:  11....11..              WAIT3  , 12 -> P
190  L01276:  .11.....1..                                 1 -> F3
191  L01277:  1....1.1..                                  DISPLAY OFF
192  L01300:  ...1.1.1..                                  C EXCHANGE M
```

```
193  L01301:  .1....111.
194  L01302:  ....11....
195  L01303:  ...1.1....                        WAIT41:  C EXCHANGE M
196  L01304:  11...11.11  -> L1306                       GO TO WAIT42
197  L01305:  .11...1....  -> L3306    *****   ODEC0 :  SELECT ROM 3
198  L01306:  1.1.11.1..              *****   WAIT42:  DELAYED SELECT GROUP 1
199  L01307:  11...1..11  -> L1312                      GO TO Q312
200  L01310:  1.1111.1.1  -> L1275              WAIT8 :  JSB WAIT3
201  L01311:  111.1.....                                 1 -> F7                    52
202  L01312:  ..11.1.1..                                 IF S3 # 1
203  L01313:  11..11.111  -> L1315                         THEN GO TO WAIT7
204  L01314:  1.....1....  -> L4315   *****             SELECT ROM 4      PROG
205  L01315:  .1....1....  -> L2316   *****   WAIT7 :  SELECT ROM 2      RUN
206  L01316:  .1....1111  -> L1103                      GO TO RTP3
207  L01317:  ..11...11.                        WAIT45:  0 -> C[M]
208  L01320:  1..111..1  -> L1216                        JSB DSCI50
209  L01321:  ...11...1.                        WAIT33:  IF C[P] >= 1
210  L01322:  111...1.11  -> L1342                         THEN GO TO WAIT34
211  L01323:  .. 1.11...                                 LOAD CONSTANT 1
212  L01324:  ..11...11.                        WAIT43:  0 -> C[M]
213  L01325:  .11...11.1  -> L1143                       JSB WAIT36
214  L01326:  1..1.1....                        WAIT9 :  IF S9 # 1
215  L01327:  1..1...1.11 -> L1222                         THEN GO TO WAIT1
216  L01330:  1..11..1..                                 0 -> S9
217  L01331:  1.1....1..                        WAIT23:  1 -> S10
218  L01332:  ....1.1...                        WAIT17:  DISPLAY TOGGLE
219  L01333:  1..1..1.11  -> L1222                       GO TO WAIT1
220  L01334:  1...1.1...                        WAIT6 :  IF S8 # 1
221  L01335:  11..1...11  -> L1310                         THEN GO TO WAIT3
222  L01336:  11....1111  -> L1303                       GO TO WAIT41
223  L01337:  .11.1.....                        WAIT29:  1 -> F3
224  L01340:  ....11.1..                                 CLEAR STATUS
225  L01341:  1..1....11  -> L1220              WAIT25:  GO TO WAIT10
226  L01342:  .1.11...1.                        WAIT34:  C - 1 -> C[P]
227  L01343:  .1.11...1.                                 C - 1 -> C[P]
228  L01344:  ...11...1.                                 IF C[P] >= 1
229  L01345:  111111..11  -> L1374                         THEN GO TO WAIT37
230  L01346:  ..11.11...                                 LOAD CONSTANT 3
231  L01347:  11.1.1..11  -> L1324                       GO TO WAIT43
232  L01350:  1....1.1..                        WAIT13:  IF S8 # 1
233  L01351:  ..1....111  -> L1041                         THEN GO TO WAIT30
234  L01352:  11........                                 POINTER ADVANCE
235  L01353:  ....1.1...                                 DISPLAY TOGGLE
236  L01354:  ..1.1.1...                                 C EXCHANGE M
237  L01355:  .1....111.                                 SHIFT LEFT A[W]
238  L01356:  1.111..1..                        WAIT40:  0 -> S11
239  L01357:  1.111.....                        WAIT27:  0 -> F5
240  L01360:  1.11.1.1..                                 IF S11 # 1
241  L01361:  111.111111  -> L1357                         THEN GO TO WAIT27
242  L01362:  1.111.....                                 0 -> F5
243  L01363:  .1...1....  -> L2364  *****   WAIT32:  SELECT ROM 2
244  L01364:  .11.1...1.                        WAIT35:  IF C[P] = 0
245  L01365:  1111111.11  -> L1376                         THEN GO TO WAIT38
246  L01366:  .1.11...1.                                 C - 1 -> C[P]
247  L01367:  .11.1...1.                                 IF C[P] = 0
248  L01370:  11 111111  -> L1317                          THEN GO TO WAIT45
249  L01371:  .1.11   1.                                 C - 1 -> C[P]
250  L01372:  .1.  1.                                    IF C[P] >= 1
251  L01373:  1..  1  111  -> L1211                        THEN GO TO WAIT44
252  L01374:  .1111...1.                        WAIT37:  C + 1 -> C[P]
253  L01375:  1111...1.                                  C + 1 -> C[P]
254  L01376:  .1.1.1...                         WAIT38:  C EXCHANGE M
255  L01377:  11.1.11.11  -> L1326                       GO TO WAIT9
ROM02 OBJECT PROGRAM

0  L02000.  1.1...1.11  -> L2142            NOOP :  GO TO NOOP1         NOP
  1  L02001:  1111....11  -> L2046            STO4 :  GO TO FCH60         STO 4
  2  L02002:  1.1..1.     -> L5003    *****   DIG3 :  SELECT ROM 5         3
  3  L02003:  1.1..1.     -> L5004    *****   DIG2 :  SELECT ROM 5         2
  4  L02004  .1  1.       -> L5005    *****   DIG1 :  SELECT ROM 5         1
  5. L02005  1111    11   -> L2340            STO5 :  GO TO FCH60         STO 5
```

| # | Addr | Code | Jump | | Op | Action | Key |
|---|---|---|---|---|---|---|---|
| 6 | L02006 | 11..1..11 | -> L2310 | | MPY | GO TO ARTH2 | X |
| 7 | L02007 | 1 1 1. | -> L5010 | ***** | XNEY | SELECT ROM 5 | x≠y |
| 8 | L02010 | 111..11111 | -> L2347 | | G | GO TO FCN50 | g |
| 9 | L02011 | 111...1.11 | -> L2342 | | PUP | GO TO PUP1 | R↑ |
| 10 | L02012 | 111 11111 | -> L2347 | | RCL | GO TO FCN50 | RCL |
| 11 | L02013 | 111 11111 | -> L2347 | | STO | GO TO FCN50 | STO |
| 12 | L02014 | 111 11111 | -> L2347 | | FI | GO TO FCN50 | f-1 |
| 13 | L02015 | 1 .11.111 | -> L2215 | | RUN | GO TO RUN1 | R↓ |
| 14 | L02016 | 111 11111 | -> L2347 | | F | GO TO FCN50 | f |
| 15 | L02017 | 1111 . 11 | -> L2360 | | RCL8 | GO TO FCN60 | RCL 8 |
| 16 | L02020 | 1111...11 | -> L2360 | | RCL7 | GO TO FCN60 | RCL 7 |
| 17 | L02021 | 11.1.1.11 | -> L2322 | | EXCG | GO TO EXCG0 | x⇌y |
| 18 | L02022 | 1.1...1.. | -> L5023 | ***** | DIG6 | SELECT ROM 5 | 6 |
| 19 | L02023 | 1 1 .1. | -> L5024 | ***** | DIG5 | SELECT ROM 5 | 5 |
| 20 | L02024 | 1 1..1.. | -> L5025 | ***** | DIG4 | SELECT ROM 5 | 4 |
| 21 | L02025 | 1111 .11 | -> L2360 | | RCL6 | GO TO FCN60 | RCL 6 |
| 22 | L02026 | 11..1..111 | -> L2311 | | PLS | GO TO ARTH1 | + |
| 23 | L02027 | 1111...11 | -> L2360 | | RCL4 | GO TO FCN60 | RCL 4 |
| 24 | L02030 | 111.1..111 | -> L2351 | | E | GO TO FCN40 | E |
| 25 | L02031 | 1.1..1.... | -> L5032 | ***** | XEQY | SELECT ROM 5 | x=y |
| 26 | L02032 | 111.1..111 | -> L2351 | | D | GO TO FCN40 | D |
| 27 | L02033 | 111.1..111 | -> L2351 | | C | GO TO FCN40 | C |
| 28 | L02034 | 111.1..111 | -> L2351 | | B | GO TO FCN40 | B |
| 29 | L02035 | 1111...11 | -> L2360 | | RCL5 | GO TO FCN60 | RCL 5 |
| 30 | L02036 | 111.1..111 | -> L2351 | | A | GO TO FCN40 | A |
| 31 | L02037 | 1111...11 | -> L2360 | | RCL3 | GO TO FCN60 | RCL 3 |
| 32 | L02040 | 1111...11 | -> L2360 | | RCL2 | GO TO FCN60 | RCL 2 |
| 33 | L02041 | 1111 .11 | -> L2360 | | RCL1 | GO TO FCN60 | RCL 1 |
| 34 | L02042 | .1....111 | -> L2101 | | DATA | GO TO DATA0 | R/S |
| 35 | L02043 | 1 111. 111 | -> L2271 | | DEC | GO TO DEC0 | . |
| 36 | L02044 | 1 1..1.. | -> L5045 | ***** | DIG0 | SELECT ROM 5 | 0 |
| 37 | L02045 | 1111...11 | -> L2360 | | ST07 | GO TO FCN60 | STO 7 |
| 38 | L02046 | 11.. 11111 | -> L2307 | | DVD | GO TO ARTH3 | ÷ |
| 39 | L02047 | .1..1... | -> L1050 | ***** | ENTR2 | SELECT ROM 1 | |
| 40 | L02050 | 111..11111 | -> L2347 | | SST | GO TO FCN50 | SST |
| 41 | L02051 | 1 1 .1... | -> L5052 | ***** | XGTY | SELECT ROM 5 | x>y |
| 42 | L02052 | 111 .11111 | -> L2347 | | RTN | GO TO FCN50 | RTN |
| 43 | L02053 | 111. 11111 | -> L2347 | | LBL | GO TO FCN50 | LBL |
| 44 | L02054 | 111 11111 | -> L2347 | | GTO | GO TO FCN50 | GTO |
| 45 | L02055 | 1111 .11 | -> L2360 | | ST05 | GO TO FCN60 | STO 5 |
| 46 | L02056 | 111 11111 | -> L2347 | | DSP | GO TO FCN50 | DSP |
| 47 | L02057 | 1111....11 | -> L2360 | | ST03 | GO TO FCN60 | STO 3 |
| 48 | L02060 | 1111....11 | -> L2360 | | ST02 | GO TO FCN60 | STO 2 |
| 49 | L02061 | 1111....11 | -> L2360 | | ST01 | GO TO FCN60 | STO 1 |
| 50 | L02062 | 1.1..1.... | -> L5063 | ***** | DIG9 | SELECT ROM 5 | 9 |
| 51 | L02063 | 1 1..1. | -> L5064 | ***** | DIG8 | SELECT ROM 5 | 8 |
| 52 | L02064 | 1.1..1.... | -> L5065 | ***** | DIG7 | SELECT ROM 5 | 7 |
| 53 | L02065 | 1111 .11 | -> L2360 | | ST08 | GO TO FCN60 | STO 8 |
| 54 | L02066 | 11 1 1.11 | -> L2312 | | MNS | GO TO ARTH0 | - |
| 55 | L02067 | 1 1..1... | -> L5070 | ***** | XLEY | SELECT ROM 5 | x≤y |
| 56 | L02070 | 1..111..11 | -> L2374 | | CLX | GO TO CLR10 | CLX |
| 57 | L02071 | .......... | | | | NO OPERATION | |
| 58 | L02072 | 1.11111111 | -> L2277 | | EEX | GO TO EEX0 | EEX |
| 59 | L02073 | 1.11111 111 | -> L2375 | | CHS | GO TO CHS0 | CHS |
| 60 | L02074 | .....1.... | -> L0075 | ***** | LSTX | SELECT ROM 0 | LSTX |
| 61 | L02075 | .......... | | | | NO OPERATION | |
| 62 | L02076 | ..1..11111 | -> L2047 | | ENTR | GO TO ENTR2 | ENTER↑ |
| 63 | L02077 | ..1.1.1... | | | MRK | C EXCHANGE M | |
| 64 | L02100 | 1...111111 | -> L2217 | | | GO TO ENDS3 | |
| 65 | L02101 | ..11....11 | | | DATA0 | 0 -> C[M] | |
| 66 | L02102 | 1..1.11.1.. | | ***** | | DELAYED SELECT GROUP 1 | |
| 67 | L02103 | ..1.11.1.. | | | ENTR1 | C EXCHANGE M | |
| 68 | L02104 | .1..1.1... | | | | C -> STACK | |
| 69 | L02105 | 1..1111111 | -> L2237 | | | GO TO CLR23 | |
| 70 | L02106 | 111.11..11 | -> L2354 | | | GO TO DATA6 | |
| 71 | L02107 | 1.1..1..1. | | | DEN7 | SHIFT RIGHT B[WP] | |
| 72 | L02110 | .11.111..1 | -> L2156 | | | JSB DEN5 | |
| 73 | L02111 | 1..1....11 | -> L2220 | | | GO TO SDGT9 | |
| 74 | L02112 | ....1.1.1.. | | | DEN13 | IF S1 # 1 | |
| 75 | L02113 | 1.1..1.111 | -> L2245 | | | THEN GO TO DEN12 | |
| 76 | L02114 | .111.1.1.. | | | | IF S7 # 1 | |
| 77 | L02115 | .1.11...11 | -> L2130 | | | THEN GO TO DEN9 | |

```
 78  L02116:  111.1.1.1.                        A EXCHANGE C[X]
 79  L02117:  1.11..111.                        SHIFT RIGHT A[W]
 80  L02120:  ...1..11..                        1 -> P
 81  L02121:  .11..1..1.                        C -> A[WP]
 82  L02122:  .11.111111 -> L2157               GO TO DEN17
 83  L02123:  .....11.1..             CLSTS1:   CLEAR STATUS
 84  L02124:  .....11....                       RETURN
 85  L02125:  ..........                        NO OPERATION
 86  L02126:  ..........                        NO OPERATION
 87  L02127:  1.1...111.              DEN16 :   SHIFT RIGHT B[W]
 88  L02130:  1....1.111.             DEN9  :   B EXCHANGE C[W]
 89  L02131:  .1111.111.                        C + 1 -> C[W]
 90  L02132:  ......11..                        0 -> P
 91  L02133:  ...11...1.              DEN3  :   IF C[P] >= 1
 92  L02134:  .11.1..111 -> L2151                 THEN GO TO DEN2
 93  L02135:  ....1111..                        P + 1 -> P
 94  L02136:  .1...1..1.                        SHIFT LEFT A[WP]
 95  L02137:  .1.11.1111 -> L2133               GO TO DEN3
 96  L02140:  ..1.1.1...              CHS1  :   C EXCHANGE M
 97  L02141:  1.11..111.                        SHIFT RIGHT A[W]
 98  L02142:  .111.1.1..                        IF S7 # 1
 99  L02143:  1..1.11111 -> L2227                 THEN GO TO CHS2
100  L02144:  111.1.1.1.                        A EXCHANGE C[X]
101  L02145:  ..11111.1.                        0 - C - 1 -> C[XS]
102  L02146:  111.1.1.1.                        A EXCHANGE C[X]
103  L02147:  ...11.111111 -> L2157             GO TO DEN17
104  L02150:  1.1..1.... -> L5151  *****  ARTH4 : SELECT ROM 5
105  L02151:  .1.11.111.              DEN2  :   C - 1 -> C[W]
106  L02152:  1...1.111.                        B EXCHANGE C[W]
107  L02153:  ..111.11..                        IF P # 3
108  L02154:  1111.11.11 -> L2366                 THEN GO TO DEN4
109  L02155:  1.1111..1.                        0 -> A[WP]
110  L02156:  1.11.1.11.              DEN5  :   SHIFT RIGHT A[MS]
111  L02157:  .11..1111.              DEN17 :   C -> A[S]
112  L02160:  .111.1.1..              DEN15 :   IF S7 # 1
113  L02161:  .111..1111 -> L2163                 THEN GO TO DEN14
114  L02162:  ....1.1.1.                        0 -> B[X]
115  L02163:  1..1...1..              DEN14 :   1 -> S9
116  L02164:  .1111.....                        0 -> F3
117  L02165:  ...1.1....                        1 -> F1
118  L02166:  ...1.1.... -> L1167  *****        SELECT ROM 1
119  L02167:  1....1.1..              CLSTS0:   IF S8 # 1
120  L02170:  .1.1..1111 -> L2123                 THEN GO TO CLSTS1
121  L02171:  .....11.1..                       CLEAR STATUS
122  L02172:  1.....1...                        1 -> S8
123  L02173:  .....11...                        RETURN
124  L02174:  .111.111.1 -> L2167               JSB CLSTS0
125  L02175:  ..1..1.... -> L1176  *****        SELECT ROM 1
126  L02176:  .11.111.1.              BNDS0 :   IF C[XS] = 0
127  L02177:  11.111..11 -> L2334                 THEN GO TO BNDS5
128  L02200:  .111111.1.                        C + 1 -> C[XS]
129  L02201:  .11.111.1.                        IF C[XS] = 0
130  L02202:  11.11..111 -> L2331                 THEN GO TO BNDS2
131  L02203:  .111111.1.                        C + 1 -> C[XS]
132  L02204:  .11.111.1.                        IF C[XS] = 0
133  L02205:  111.1.1.11 -> L2352                 THEN GO TO UFLW
134  L02206:  ..11...11.              OFLW  :   0 -> C[M]
135  L02207:  ..11...1.1                        0 -> C[X]
136  L02210:  .1.11..11.                        C - 1 -> C[M]
137  L02211:  .1.11.1.1.                        C - 1 -> C[X]
138  L02212:  1..1..1.1.                        SHIFT RIGHT C[X]
139  L02213:  ....11.1..              BNDS4 :   CLEAR STATUS
140  L02214:  1.11.11.11 -> L2266               GO TO BNDS5
141  L02215:  ..1.1.1...              RDN1  :   C EXCHANGE M
142  L02216:  111..1.111 -> L2345               GO TO ROLL1
143  L02217:  ..1..1.... -> L1220  *****  BNDS3 : SELECT ROM 1
144  L02220:  .111.111.1 -> L2167               SDGT9 : JSB CLSTS0
145  L02221:  ..11..11..                        3 -> P
146  L02222:  1.1..1.... -> L5223  *****        SELECT ROM 5
147  L02223:  ....11.1..              DATA2 :   CLEAR STATUS
148  L02224:  1......1..                        1 -> S8
```

| | | | |
|---|---|---|---|
| 149 | L02225: | 1.1.....1.. | |
| 150 | L02226: | 1...111111 -> L2217 | |
| 151 | L02227: | ..1111111. | |
| 152 | L02230: | .11..1111. | |
| 153 | L02231: | .1111..... | |
| 154 | L02232: | 1..1...1.. | |
| 155 | L02233: | .111111.11 -> L2176 | |
| 156 | L02234: | ..11...11. | |
| 157 | L02235: | ..1.1.1... | |
| 158 | L02236: | ..11..111. | |
| 159 | L02237: | ..111..... | |
| 160 | L02240: | .111.111.1 -> L2167 | |
| 161 | L02241: | 11.111..11 -> L2334 | |
| 162 | L02242: | ..11...11. | |
| 163 | L02243: | ..1.1.1... | |
| 164 | L02244: | 1.1.....11 -> L2240 | |
| 165 | L02245: | 1.111..1.. | |
| 166 | L02246: | ..111..... | |
| 167 | L02247: | 1.11.1.1.. | |
| 168 | L02250: | 1.1.1.1.11 -> L2252 | |
| 169 | L02251: | .1..1.1... | |
| 170 | L02252: | ..11..111. | |
| 171 | L02253: | 11.....11.. | |
| 172 | L02254: | .1.111..1. | |
| 173 | L02255: | .11111111. | |
| 174 | L02256: | .11111111. | |
| 175 | L02257: | 1...1.111. | |
| 176 | L02260: | ..11..111. | |
| 177 | L02261: | ..1..1.1.. | |
| 178 | L02262: | .1.1.11111 -> L2127 | |
| 179 | L02263: | .1.11...11 -> L2130 | |
| 180 | L02264: | 1..1.1.1.. | |
| 181 | L02265: | 1...1.1111 -> L2223 | |
| 182 | L02266: | .11.1..... | |
| 183 | L02267: | 1.1.....11 -> L2240 | |
| 184 | L02270: | ..1..1.1.. -> L1271 | |
| 185 | L02271: | ...11.11. | |
| 186 | L02272: | 1.111..11 -> L2270 | |
| 187 | L02273: | ..1.....1. | |
| 188 | L02274: | ...1.1.1.. | |
| 189 | L02275: | ..1..1..11 -> L2044 | |
| 190 | L02276: | 11...1..11 -> L2304 | |
| 191 | L02277: | ....11..11. | |
| 192 | L02300: | ..1..11111 -> L2047 | |
| 193 | L02301: | .111...... | |
| 194 | L02302: | ....1.1.1.. | |
| 195 | L02303: | .....1..11 -> L2004 | |
| 196 | L02304: | ..1.1.1... | |
| 197 | L02305: | 1.11..111. | |
| 198 | L02306: | .11.1111.1 -> L2157 | |
| 199 | L02307: | 11111.1.1. | |
| 200 | L02310: | 11111.1.1. | |
| 201 | L02311: | 11111.1.1. | |
| 202 | L02312: | .111.111.1 -> L2167 | |
| 203 | L02313: | .11.1..11. | |
| 204 | L02314: | .11.1...11 -> L2150 | |
| 205 | L02315: | 1.....1.... -> L4316 | |
| 206 | L02316: | ..11.1.... | |
| 207 | L02317: | .......... | |
| 208 | L02320: | .11.1..... | |
| 209 | L02321: | .111111.11 -> L2176 | |
| 210 | L02322: | ..1.1.1... | |
| 211 | L02323: | .11.1.1... | |
| 212 | L02324: | .1..1.1... | |
| 213 | L02325: | 111.1.111. | |
| 214 | L02326: | ..1.1..... | |
| 215 | L02327: | .111.111.1 -> L2167 | |
| 216 | L02330: | .111111.11 -> L2176 | |
| 217 | L02331: | .111.1.1.1. | |
| 218 | L02332: | 111.1.1.11 -> L2352 | |
| 219 | L02333: | .1.1111.1. | |
| 220 | L02334: | ....11..11. | |

```
                 1 -> S10
                 GO TO BNDS3
       CHS2   :  0 - C - 1 -> C[S]
                 C -> A[S]
                 0 -> F3
                 1 -> S9
                 GO TO BNDS0
       CLR10  :  0 -> C[M]
       CLR11  :  C EXCHANGE M
                 0 -> C[W]
       CLR23  :  0 -> F1
       CLR24  :  JSB CLSTS0
                 GO TO BNDS5
       NOOP1  :  0 -> C[M]
                 C EXCHANGE M
                 GO TO CLR24
       DEN12  :  0 -> S11
                 0 -> F1
                 IF S11 # 1
                     THEN GO TO RSET2
                 C -> STACK
       RSET2  :  0 -> C[W]
                 12 -> P
                 C - 1 -> C[WP]
                 C + 1 -> C[S]
                 C + 1 -> C[S]
                 B EXCHANGE C[W]
                 0 -> C[W]
                 IF S2 # 1
                     THEN GO TO DEN16
                 GO TO DEN9
       DATA1  :  IF S9 # 1
                     THEN GO TO DATA2
       BNDS6  :  1 -> F3
                 GO TO CLR24
***** DEC2   :  SELECT ROM 1
       DEC0   :  IF C[M] >= 1
                     THEN GO TO DEC2
       DEC1   :  1 -> S2
                 IF S1 # 1
                     THEN GO TO DIG0
                 GO TO EEX1
       EEX0   :  IF C[M] >= 1
                     THEN GO TO ENTR2
       EEX2   :  1 -> S7
                 IF S1 # 1
                     THEN GO TO DIG1
       EEX1   :  C EXCHANGE M
                 SHIFT RIGHT A[W]
                 JSB DEN17
       ARTH3  :  A + 1 -> A[X]
       ARTH2  :  A + 1 -> A[X]
       ARTH1  :  A + 1 -> A[X]
       ARTH0  :  JSB CLSTS0
                 IF C[M] = 0
                     THEN GO TO ARTH4
***** SELECT ROM 4
       KEYS -> ROM ADDRESS
                 NO OPERATION
       ERR3   :  1 -> F3
                 GO TO BNDS0
       EXCG0  :  C EXCHANGE M
                 STACK -> A
                 C -> STACK
                 A EXCHANGE C[W]
       FRTN1  :  1 -> F1
       FRTN2  :  JSB CLSTS0
                 GO TO BNDS0
       BNDS2  :  IF C[X] = 0
                     THEN GO TO UFLW
                 C - 1 -> C[XS]
       BNDS5  :  IF C[M] >= 1
```

```
221  L02335;  11 1111111  -> L2337                       THEN GO TO BNDS7
222  L02336.  ..11..111.                                 0 -> C[W]
223  L02337;  111.1.11..                          BNDS7 : IF P # 14
224  L02340;  1...111111  -> L2317                        ..   THEN GO TO BNDS3
225  L02341.  .....1....  -> L0342   *****               SELECT ROM 0
226  L02342.  ..1.1.1...                          RUP1  : C EXCHANGE M
227  L02343;  11..1 1 .                                  DOWN ROTATE
228  L02344. .11. 1.1..                                  DOWN ROTATE
229  L02345. 11..1.1..                            ROLL1 : DOWN ROTATE
230  L02346. 11.1 11.11  -> L2326                        GO TO FRTN1
231  L02347. 1... 1.     -> L4350   *****         FCN50 : SELECT ROM 4
232  L02350  11 1.11111  -> L2327                        GO TO FRTN2
233  L02351  1....1....  -> L4352   *****         FCN40 : SELECT ROM 4
234  L02352.  ..11 .111.                          UFLW  : 0 -> C[W]
235  L02353  1...1.11.1  -> L2213                        JSB BNDS4
236  L02354   .. 1.1.1 .                          DATAG : IF S1 # 1
237  L02355  1..1 1111   -> L2213                          THEN GO TO BNDS4
238  L02356. ..111.....                                  0 -> F1
239  L02357; 1...1.1111  -> L2213                        GO TO BNDS4
240  L02360.  .....1....  -> L0361   *****         FCN60 : SELECT ROM 0
241  L02361.  .1...111.                           DEN6  : SHIFT LEFT A[W]
242  L02362.  ..1...1...                                 1 -> S1
243  L02363. .11 111 11  -> L2156                        GO TO DEN5
244  L02364.  ...1......                                 BUFFER -> ROM ADDRESS
245  L02365.  ......11   -> L3000                        GO TO NOOP
246  L02366.  .  1.1 1                            DEN4  : IF S1 # 1
247  L02367  1111  111   -> L2361                          THEN GO TO DEN6
248  L02370   .1 .1.1                                    IF S2 # 1
249  L02371.  .1...11111 -> L2107                          THEN GO TO DEN7
250  L02372  .....111..                                  P - 1 -> P
251  L02373  ....1. 1..                                  0 -> E[P]
252  L02374. .11.111..1  -> L2156                        JSB DEN5
253  L02375; .11.1..11.                           CHS0  : IF C[M] = 0
254  L02376; .11.....11  -> L2140                          THEN GO TO CHS1
255  L02377; ..1..11111  -> L2047                        GO TO ENTR2

0    L03000;  .1.11.1.1.                          FMOD3 : C - 1 -> C[X]
1    L03001.  .1.11.1.1.                                 C - 1 -> C[X]
2    L03002.  .11...111.                                 C -> A[W]
3    L03003.  ...1..1..1  -> L3042                       JSB FMOD4
4    L03004.  ..1..1....  -> L1005   *****         FDGT8 : SELECT ROM 1
5    L03005.  .1111..11   -> L3074                       GO TO DMST2
6    L03006.                                             NO OPERATION
7    L03007.  ..........                                 NO OPERATION
8    L03010   11...1....  -> L6011   *****         TANX  : SELECT ROM 6
9    L03011.  1.1.1. 1..                          PI21  : 0 -> S10
10   L03012.  11.....11..                         PI20  : 12 -> P
11   L03013.  ..11..111.                                 0 -> C[W]
12   L03014;  ...1..11...                                LOAD CONSTANT 1
13   L03015.  .1.1.11...                                 LOAD CONSTANT 5
14   L03016.  .111.11...                                 LOAD CONSTANT 7
15   L03017;  .....11...                                 LOAD CONSTANT 0
16   L03020.  .111.11...                                 LOAD CONSTANT 7
17   L03021;  1...1.11...                                LOAD CONSTANT 9
18   L03022.  .11..11...                                 LOAD CONSTANT 6
19   L03023.  ...11.11...                                LOAD CONSTANT 3
20   L03024;  ...1..11...                                LOAD CONSTANT 2
21   L03025.  .111.11...                                 LOAD CONSTANT 7
22   L03026.  11.....11..                                12 -> P
23   L03027;  ....11....                                 RETURN
24   L03030.  11...1....  -> L6031   *****         RET   : SELECT ROM 6
25   L03031;  .1...1.1..                                 IF S4 # 1
26   L03032;  ...11...11  -> L3030                         THEN GO TO RET
27   L03033. 1.1.11.1..          #####                   DELAYED SELECT GROUP 1
28   L03034.  ..1..1....  -> L1035   *****               SELECT ROM 1
29   L03035. 11.11...1.                            FMOD1 : A - 1 -> A[P]
30   L03036.  ......11    -> L3000                       IF NO CARRY GO TO FMOD3
31   L03037. .1.11.1.1.                                  C - 1 -> C[X]
32   L03040. 11..1111.1  -> L3317                        JSB LD90
33   L03041. 1.1 .1 1.1  -> L3245                        JSB DVD30
34   L03042.   .1..1 .1   -> L3012                 FMOD4 : JSB PI20
35   L03043. .1.1.1..1   -> L3244                        JSB MPY30
36   L03044. 11.1111.11  -> L3336                        GO TO FMOD2
```

| # | Label | Bits | Target | | Label | Code |
|---|---|---|---|---|---|---|
| 37 | L03045 | 1.11 1 1 | | TDMS3 : | C - 1 -> C[X] |
| 38 | L03046 | 11 .111. 1 | -> L3316 | | JSB LD91 |
| 39 | L03047 | 1.1..1...1 | -> L3244 | | JSB MPY30 |
| 40 | L03050 | .1.11..11 | -> L3130 | | GO TO TDMS2 |
| 41 | L03051 | 1...1.1 | -> L3202 | DOCT0 : | JSB INT6 |
| 42 | L03052 | 1.1.11.1. | | ##### | DELAYED SELECT GROUP 1 |
| 43 | L03053. | .1...1.. | -> L2054 | ***** | SELECT ROM 2 |
| 44 | L03054 | 11...1... | -> L6055 | ***** SQT2 : | SELECT ROM 6 |
| 45 | L03055 | 1111111 1 | | FIDGT7: | H + 1 -> A[XS] |
| 46 | L03056 | 1 ....111 | -> L3201 | | IF NO CARRY GO TO FIDGT8 |
| 47 | L03057. | 11.1.1.11 | -> L3152 | | GO TO DMSM0 |
| 48 | L03060 | .11. .111. | | | C -> A[W] |
| 49 | L03061 | ...1.1 1 | | | IF S1 # 1 |
| 50 | L03062. | . 1 11 .1 | -> L2004 | | THEN GO TO SQT2 |
| 51 | L03063. | 1111..1. 1 | -> L3362 | | JSB ADP9 |
| 52 | L03064. | .111.1.1 | | | IF S7 # 1 |
| 53 | L03065. | .11.....11 | -> L3140 | | THEN GO TO FMOD0 |
| 54 | L03066. | 111...1111 | -> L3343 | | GO TO MAG0 |
| 55 | L03067. | .......... | | | NO OPERATION |
| 56 | L03070 | .11 ..111 | | SIN12 : | C -> A[W] |
| 57 | L03071. | 11...1 . | -> L6072 | ***** | SELECT ROM 6 |
| 58 | L03072: | 1111..1. 1 | -> L3362 | | JSB ADP9 |
| 59 | L03073: | 111...1111 | -> L3343 | | GO TO MAG0 |
| 60 | L03074. | 1.1....1.. | | DMST2 : | 1 -> S10 |
| 61 | L03075. | 11.....11. | | | 12 -> P |
| 62 | L03076: | 1.1. 1.1.1 | -> L3245 | | JSB DVD30 |
| 63 | L03077: | .11...1.. | | | IF S6 # 1 |
| 64 | L03100. | 1.1.111.11 | -> L3256 | | THEN GO TO DMST5 |
| 65 | L03101: | .11.1..1.. | | | 0 -> S6 |
| 66 | L03102: | .11.1.1... | | | STACK -> A |
| 67 | L03103: | .1...1.1... | | | C -> STACK |
| 68 | L03104: | 111.1.111. | | | A EXCHANGE C[W] |
| 69 | L03105: | .1.....1.. | | | 1 -> S4 |
| 70 | L03106: | .11.11..11 | -> L3154 | | GO TO DMST0 |
| 71 | L03107: | 1.1..111.1 | -> L3247 | DMST6 : | JSB MOD10 |
| 72 | L03110: | 11.11....1 | | | A - 1 -> A[P] |
| 73 | L03111: | 11.1.11111 | -> L3327 | | IF NO CARRY GO TO DMST3 |
| 74 | L03112: | .1.11.1.1 | | | C - 1 -> C[X] |
| 75 | L03113: | 11..111..1 | -> L3316 | | JSB LD91 |
| 76 | L03114: | 1.1..1.1.1 | -> L3245 | | JSB DVD30 |
| 77 | L03115: | ....1..1.1 | -> L3011 | | JSB PI21 |
| 78 | L03116: | 1..1.1..11 | -> L3244 | | GO TO MPY30 |
| 79 | L03117: | 1111...1.1 | -> L3361 | RTP9 : | JSB RTP13 |
| 80 | L03120: | 1.1...1..1 | -> L3244 | | JSB MPY30 |
| 81 | L03121: | 1.11111... | | | DATA -> C |
| 82 | L03122: | 1...1..1.1 | -> L3211 | | JSB ADD10 |
| 83 | L03123: | 1.1.11.1.. | | ##### | DELAYED SELECT GROUP 1 |
| 84 | L03124: | ...1..1.... | -> L1125 | ***** | SELECT ROM 1 |
| 85 | L03125: | .......... | | | NO OPERATION |
| 86 | L03126: | 11.11...1. | | TDMS1 : | A - 1 -> A[P] |
| 87 | L03127: | ...1..1.111 | -> L3045 | | IF NO CARRY GO TO TDMS3 |
| 88 | L03130: | 1.1.11.1.. | | ##### TDMS2 : | DELAYED SELECT GROUP 1 |
| 89 | L03131: | ...1..1.... | -> L1132 | ***** | SELECT ROM 1 |
| 90 | L03132: | 1.....1..1 | -> L3202 | INT0 : | JSB INT6 |
| 91 | L03133: | 11 1.1.111 | -> L3325 | | GO TO FRTN14 |
| 92 | L03134: | .1111.1.1. | | DMST4 : | C + 1 -> C[X] |
| 93 | L03135: | 11..1111.1 | -> L3317 | | JSB LD90 |
| 94 | L03136: | 1.1..1..1. | | | 0 -> S10 |
| 95 | L03137: | 1.1..1.111 | -> L3245 | | GO TO DVD30 |
| 96 | L03140: | 1.1..111.1 | -> L3247 | FMOD0 : | JSB MOD10 |
| 97 | L03141: | 11.11....1 | | | A - 1 -> A[P] |
| 98 | L03142: | ...111.111 | -> L3035 | | IF NO CARRY GO TO FMOD1 |
| 99 | L03143: | 11.1111.11 | -> L3336 | | GO TO FMOD2 |
| 100 | L03144. | .......... | | | NO OPERATION |
| 101 | L03145: | ...11..111 | | MAG4 : | 0 -> C[W] |
| 102 | L03146: | .1111...1. | | | C + 1 -> C[P] |
| 103 | L03147: | .111.1.1.. | | | IF S7 # 1 |
| 104 | L03150: | ....1...11 | -> L3010 | | THEN GO TO TANX |
| 105 | L03151: | 11....1... | -> L6152 | ***** | SELECT ROM 6 |
| 106 | L03152: | .1111111. | | DMSM0 : | 0 - C - 1 -> C[S] |
| 107 | L03153: | .11...1.. | | DMSP0 : | 1 -> S6 |
| 108 | L03154: | 1.1.11.1.. | | ##### DMST0 : | DELAYED SELECT GROUP 1 |
| 109 | L03155: | ...1. 1.... | -> L1156 | ***** | SELECT ROM 1 |

```
110  L03156;  .1111..1..
111  L03157;  1111111.1.
112  L03160;  ..1.11.111   -> L3055
113  L03161;  .11.11..11   -> L3154
114  L03162;  1.....1..1   -> L3202
115  L03163;  1.1.11.1..            #####
116  L03164;  ..1..1....   -> L2165 *****
117  L03165;  11...1....   -> L6166 *****
118  L03166;  .11...1.1.
119  L03167;  1.111.1.11   -> L3272
120  L03170;  11..11.111   -> L3315
121  L03171;  .1.11.1.1.
122  L03172;  .....111..
123  L03173;  ...11.1.1.
124  L03174;  1..1.1..11   -> L3224
125  L03175;  ..11..1.1.
126  L03176;  111.1.1.1.
127  L03177;  .11...1.1.
128  L03200;  1....11111   -> L3207
129  L03201;  ..1..1....   -> L1202 *****  FIDGT8;
130  L03202;  11....11..
131  L03203;  .11...111..
132  L03204;  .11.111.1.
133  L03205;  .1111.1.11   -> L3172
134  L03206;  ..11..111.
135  L03207;  .....11....
136  L03210;  ..1111111.
137  L03211;  1.1..1....   -> L5212 *****  ADD10;
138  L03212;  1.11.11.11   -> L3266
139  L03213;  1111111.1.
140  L03214;  .....1..11   -> L3004
141  L03215;  ..11.1.1111  -> L3153
142  L03216;  ..1...111   -> L3051
143  L03217;  ..1..1....   -> L1220 *****  WAIT50;
144  L03220;  .1111.1.1.
145  L03221;  .1111.1.1.
146  L03222;  .11...111.
147  L03223;  111111.1.1   -> L3375
148  L03224;  ..1..11.11.
149  L03225;  .1111..111   -> L3171
150  L03226;  .11111.111   -> L3175
151  L03227;  1.1.11.1..            #####  PTR3;
152  L03230;  ..1..1....   -> L1231 *****
153  L03231;  1111111.1.
154  L03232;  1...1.1111   -> L3213
155  L03233;  1.1..111.1   -> L3247    TDMS0;
156  L03234;  11.11..1.1.
157  L03235;  .1.1.11.11   -> L3126
158  L03236;  .1111.1.1.
159  L03237;  11.111..1    -> L3316
160  L03240;  1.1.1...1    -> L3244
161  L03241;  ....1.1..1   -> L3012
162  L03242;  1.1..1.1.1   -> L3245
163  L03243;  1..11..11    -> L3130
164  L03244;  11...1....   -> L6245 *****  MPY30;
165  L03245;  11...1....   -> L6246 *****  DVD30;
166  L03246;  111.1.111.
167  L03247;  ..1.1.1.
168  L03250;  .11..1.1.
169  L03251;  ..1.1.1...
170  L03252;  ......11..
171  L03253;  ....11..1.
172  L03254;  1.1....1..
173  L03255;  ....11....
174  L03256;  .1...1.1..
175  L03257;  .1...11111   -> L3107
176  L03260;  .1..1..1..
177  L03261;  1.1....1..
178  L03262;  11.1.1....
179  L03263;  11...1..11   -> L3211
180  L03264;  1...1.1.1    -> L3211
181  L03265;  1.11...11    -> L3130
182  L03266;  1.....1..1   -> L3202
```

```
FIDGT6;  0 -> S7
         A + 1 -> A[XS]
         IF NO CARRY GO TO FIDGT7
         GO TO DMST0
ODEC0 ;  JSB INT6
         DELAYED SELECT GROUP 1
         SELECT ROM 2
LPI11 ;  SELECT ROM 6
         IF S6 # 1
             THEN GO TO RMOD0
         GO TO RTP3
INT4  :  C - 1 -> C[X]
INT2  ,  P - 1 -> P
         IF C[X] >= 1
             THEN GO TO INT3
INT5     0 -> C[WP]
         A EXCHANGE C[X]
         C -> A[X]
         GO TO INT7
FIDGT8;  SELECT ROM 1
INT6  :  12 -> P
         C -> A[W]
         IF C[XS] = 0
             THEN GO TO INT2
         0 -> C[W]
INT7  ,  RETURN
SUB10 :  0 - C - 1 -> C[S]
ADD10 ;  SELECT ROM 5
         GO TO FACT0
FDGT7 ;  A + 1 -> A[XS]
         IF NO CARRY GO TO FDGT8
         GO TO DMSP0
         G0 TO DOCT0
WAIT50;  SELECT ROM 1
RMOD3 :  C + 1 -> C[X]
         C + 1 -> C[X]
         C -> A[W]
         JSB RMOD5
INT3  :  IF P # 2
             THEN GO TO INT4
         GO TO INT5
PTR3  ,  DELAYED SELECT GROUP 1
         SELECT ROM 1
FDGT6 ;  A + 1 -> A[XS]
         IF NO CARRY GO TO FDGT7
TDMS0 :  JSB MOD10
         A - 1 -> A[P]
         IF NO CARRY GO TO TDMS1
         C + 1 -> C[X]
         JSB LD91
         JSB MPY30
         JSB PI20
         JSB DVD30
         GO TO TDMS2
MPY30 ;  SELECT ROM 6
DVD30 ;  SELECT ROM 6
MOD11 ;  A EXCHANGE C[W]
MOD10 ;  C EXCHANGE M
         C -> A[X]
         C EXCHANGE M
         0 -> P
         0 -> S1
         1 -> S10
         RETURN
DMST5 :  IF S4 # 1
             THEN GO TO DMST6
         0 -> S4
         1 -> S10
         STACK -> A
         12 -> P
         JSB ADD10
         GO TO TDMS2
FACT0 ,  JSB INT6
```

```
183   L03267.  1.1.11 1..              #####           DELAYED SELECT GROUP 1
184   L03270.  ...1....    -> L0271    *****           SELECT ROM 0
185   L03271.  1...1...1   -> L1110            PTP5  : JSB SUB10
186   L03272.  1.1.11.1    -> L7246            RMOD0 : JSB MOD11
187   L03273.  11.11...1                               A - 1 -> A[P]
188   L03274.  11111..11   -> L3370                    IF NO CARRY GO TO RMOD2
189   L03275.  .11..1.1.                       RMOD6 : IF S6 # 1
190   L03276.  11.1.1.111  -> L3325                       THEN GO TO FRTN14
191   L03277.  1.1.11 1..              #####           DELAYED SELECT GROUP 1
192   L03300.  ..1..1...   -> L1301    *****           SELECT ROM 1
193   L03301.  1.1..1.1 1  -> L3245            PTR2  : JSB DVD30
194   L03302.  .11.1.1..                               STACK -> A
195   L03303.  .1..1.1..                               C -> STACK
196   L03304.  1.1..1...1  -> L3244                    JSB MPY30
197   L03305.  1..1.11111  -> L3227                    GO TO PTR3
198   L03306.  .111..1.11  -> L3162                    GO TO ODEC0
199   L03307.  1....1..1   -> L3202            FRHC0 : JSB INT6
200   L03310.  .....1...   -> L0311    *****           SELECT ROM 0
201   L03311.  .....1...   -> L0312    *****  NOSFX4: SELECT ROM 0
202   L03312.  1.1..1...1  -> L3244                    JSB MPY30
203   L03313.  1.1.11.1..              #####           DELAYED SELECT GROUP 1
204   L03314.  ..1..1...   -> L1315    *****           SELECT ROM 1
205   L03315.  .1..1....   -> L1316    *****  RTP3  : SELECT ROM 1
206   L03316.  1.1.....1..                     LD91  : 1 -> S10
207   L03317.  .11....111.                     LD90  : C -> A[W]
208   L03320.  11...11...                              12 -> P
209   L03321.  ...11..111                              0 -> C[W]
210   L03322.  .1.11...1.                              C - 1 -> C[P]
211   L03323.  ....11....                              RETURN
212   L03324.  .1.111111   -> L3117                    GO TO RTP9
213   L03325.  .1...1..    -> L2326    *****  FRTN14: SELECT ROM 2
214   L03326.  .1...1..    -> L2327    *****  FRTN13. SELECT ROM 2
215   L03327.  11.11...1.                      DMST3 : A - 1 -> A[P]
216   L03330.  .1.111..11  -> L3134                    IF NO CARRY GO TO DMST4
217   L03331.  11.1.1.111  -> L3325                    GO TO FRTN14
218   L03332.  1.1..1....  -> L5333    *****  EXIT  : SELECT ROM 5
219   L03333.  1..1..1.1..                             IF S10 # 1
220   L03334.  11.11.1.11  -> L3332                       THEN GO TO EXIT
221   L03335.  ....11....                              RETURN
222   L03336.  .11...111.                      FMOD2 : C -> A[W]
223   L03337.  ....1.111.                              0 -> B[W]
224   L03340.  11...11...                              12 -> P
225   L03341.  1.1.1..1..                              0 -> S10
226   L03342.  ....1...1.                              1 -> S1
227   L03343.  111111..1.                      MAG0  : C + 1 -> C[XS]
228   L03344.  111.11.111  -> L3355                    IF NO CARRY GO TO MAG3
229   L03345.  .11.1.1.1.                              IF C[X] = 0
230   L03346.  111.11.111  -> L3355                       THEN GO TO MAG3
231   L03347.  ...11..111.                             0 -> C[W]
232   L03350.  .......11.                              0 -> P
233   L03351.  .1.1.11...                              LOAD CONSTANT 5
234   L03352.  11...11..                               12 -> P
235   L03353.  111..1.1.                               A + C -> C[X]
236   L03354.  11..1.111   -> L3145                    IF NO CARRY GO TO MAG4
237   L03355.  .111 1.1.                       MAG3  : IF S7 # 1
238   L03356.  111.1 111   -> L3165                       THEN GO TO LPI11
239   L03357.  111.1.111.                              A EXCHANGE C[W]
240   L03360.  ..111..11   -> L3070                    GO TO SIN12
241   L03361.  .11..111.                       RTP13 : C -> A[W]
242   L03362.  1...1 111.                      ADR9  : B EXCHANGE C[W]
243   L03363.  .1.11...1                               C - 1 -> C[P]
244   L03364.  1..111...                               C -> DATA ADDRESS
245   L03365.  1..1.111.                               B EXCHANGE C[W]
246   L03366.  ...1.111.                               0 -> B[W]
247   L03367.  ....11.                                 RETURN
248   L03370.  11.11...1.                      RMOD2 : A - 1 -> A[P]
249   L03371.  1...1....11 -> L3220                    IF NO CARRY GO TO RMOD3
250   L03372.  .1111.1.1.                              C + 1 -> C[X]
251   L03373.  11..1111.1  -> L3317                    JSB LD90
252   L03374.  1.1..1...1  -> L3244                    JSB MPY30
253   L03375.  ....1.1..1  -> L3012                    JSB PI20
254   L03376.  1.1..1.1.1  -> L3245            RMOD5 : JSB DVD30
255   L03377.  1.1111.111  -> L3275                    GO TO RMOD6
```

ROM04 OBJECT PROGRAM

```
 0   L04000:  1.....1111   -> L4203           NOOP   :  GO TO FCN19
 1   L04001:  ..........                              NO OPERATION
 2   L04002:  1.1..1....   -> L5003   *****   DIG3   :  SELECT ROM 5
 3   L04003:  1.1..1....   -> L5004   *****   DIG2   :  SELECT ROM 5
 4   L04004:  1.1..1....   -> L5005   *****   DIG1   :  SELECT ROM 5
 5   L04005:  1..11.1111   -> L4233                     GO TO PAD0
 6   L04006:  1.....1111   -> L4203           MPY    :  GO TO FCN19
 7   L04007:  1.....1111   -> L4203           XNEY   :  GO TO FCN19
 8   L04010:  .11.11.111   -> L4155           G      :  GO TO P3
 9   L04011:  1.....1111   -> L4203           RUP    :  GO TO FCN19
10   L04012:  .11.111.11   -> L4156           RCL    :  GO TO P4
11   L04013:  .11.111111   -> L4157           STO    :  GO TO P5
12   L04014:  .111....11   -> L4160           FI     :  GO TO P6
13   L04015:  1.....1111   -> L4203           RDN    :  GO TO FCN19
14   L04016:  .111...111   -> L4161           F      :  GO TO P7
15   L04017:  1.1..1....                      FCN21  :  1 -> F5
16   L04020:  ...1..1...   -> L1021   *****   FCN2   :  SELECT ROM 1
17   L04021:  1.....1111   -> L4203           EXCG   :  GO TO FCN19
18   L04022:  1.1..1....   -> L5023   *****   DIG6   :  SELECT ROM 5
19   L04023:  1.1..1....   -> L5024   *****   DIG5   :  SELECT ROM 5
20   L04024:  1.1..1....   -> L5025   *****   DIG4   :  SELECT ROM 5
21   L04025:  ..........                              NO OPERATION
22   L04026:  1.....1111   -> L4203           PLS    :  GO TO FCN19
23   L04027:  1.11...11    -> L4260                     GO TO UFCN9
24   L04030:  1.....1111   -> L4203           E      :  GO TO FCN19
25   L04031:  1.....1111   -> L4203           XEQY   :  GO TO FCN19
26   L04032:  1.....1111   -> L4203           D      :  GO TO FCN19
27   L04033:  1.....1111   -> L4203           C      :  GO TO FCN19
28   L04034:  1.....1111   -> L4203           B      :  GO TO FCN19
29   L04035:  ..........                              NO OPERATION
30   L04036:  1.....1111   -> L4203           A      :  GO TO FCN19
31   L04037:  111.1..11.                      FCN27  :  IF P # 14
32   L04040:  1111..1111   -> L4363                        THEN GO TO FCN28
33   L04041:  ..1111...1   -> L4074                     JSB LSTX
34   L04042:  1.....1111   -> L4203           DATA   :  GO TO FCN19
35   L04043:  1.....1111   -> L4203           DEC    :  GO TO FCN19
36   L04044:  1.1..1....   -> L5045   *****   DIG0   :  SELECT ROM 5
37   L04045:  .....1....   -> L0046   *****   UFCN10 :  SELECT ROM 0
38   L04046:  1.....1111   -> L4203           DVD    :  GO TO FCN19
39   L04047:  .....11....                     RSETP  :  RETURN
40   L04050:  .111..1111   -> L4163           SST    :  GO TO P3
41   L04051:  1.....1111   -> L4203           XGTY   :  GO TO FCN19
42   L04052:  .111.1..11   -> L4164           RTN    :  GO TO P9
43   L04053:  .111.1.111   -> L4165           LBL    :  GO TO P10
44   L04054:  .111.11.11   -> L4166           GTO    :  GO TO P11
45   L04055:  ..........                              NO OPERATION
46   L04056:  .111.11111   -> L4167           DSP    :  GO TO FCN0
47   L04057:  11.1111111   -> L4337                     GO TO FCN8
48   L04060:  1.1.11.1..                      *****   ARTH4  :  DELAYED SELECT GROUP 1
49   L04061:  .....1....   -> L0062   *****              SELECT ROM 0
50   L04062:  1.1..1....   -> L5063   *****   DIG9   :  SELECT ROM 5
51   L04063:  1.1..1....   -> L5064   *****   DIG8   :  SELECT ROM 5
52   L04064:  1.1..1....   -> L5065   *****   DIG7   :  SELECT ROM 5
53   L04065:  ..........                              NO OPERATION
54   L04066:  1.....1111   -> L4203           MNS    :  GO TO FCN19
55   L04067:  1.....1111   -> L4203           XLEY   :  GO TO FCN19
56   L04070:  ...11..11.                      CLX    :  IF C[M] >= 1
57   L04071:  .1.111.111   -> L4135                         THEN GO TO CLR20
58   L04072:  1.....1111   -> L4203           EEX    :  GO TO FCN19
59   L04073:  1.....1111   -> L4203           CHS    :  GO TO FCN19
60   L04074:  1.....1111   -> L4203           LSTX   :  GO TO FCN19
61   L04075:  ....1..1.1   -> L4011           FCN25  :  JSB RUP
62   L04076:  1.....1111   -> L4203           ENTR   :  GO TO FCN19
63   L04077:  11...1.11.                      FCN11  :  IF P # 12
64   L04100:  .1..1.1.11   -> L4112                        THEN GO TO FCN23
65   L04101:  .....111.1   -> L4007                     JSB XNEY
66   L04102:  ...1..1.1.                      UFCN4  :  IF S9 # 1
67   L04103:  11....1.11   -> L4302                        THEN GO TO UFCN5
68   L04104:  .1........                              MARK AND SEARCH
69   L04105:  .11111111.                              C + 1 -> C[S]
```

```
 70   L04106:   .11111111.
 71   L04107:   .....11.1..
 72   L04110:   1.1.....1..
 73   L04111:   1111111..1    -> L4376
 74   L04112:   11..11..11..
 75   L04113:   ..1111111    -> L4037
 76   L04114:   11.1111..1.
 77   L04115:   1...1.1.111   -> L4225
 78   L04116:   ...1...1.1   -> L4021
 79   L04117:   ..........
 80   L04120:   .1111....1
 81   L04121:   1.....1.1.
 82   L04122:   11.1111111   -> L4337
 83   L04123:   ...1.1.1...
 84   L04124:   .....11.1..
 85   L04125:   1.......1..
 86   L04126:   1...111111   -> L4217
 87   L04127:   1.111..1..
 88   L04130:   1.111.....
 89   L04131:   1.11.1.1..
 90   L04132:   .1.11...11   -> L4130
 91   L04133:   1.111.....
 92   L04134:   .....11...
 93   L04135:   ....11..11..
 94   L04136:   .11.1...1
 95   L04137:   1..11...11   -> L4230
 96   L04140:   .11.......
 97   L04141:   .1..1.111.1   -> L4127
 98   L04142:   .11.......
 99   L04143:   1.1111.1.1   -> L4275
100   L04144:   111...1111   -> L4343
101   L04145:   1.11..11..
102   L04146:   ...11....1.
103   L04147:   1.1.111111   -> L4257
104   L04150:   1.1...11..
105   L04151:   ...11...1.
106   L04152:   1111....11   -> L4360
107   L04153:   1.1..1....   -> L5154    *****
108   L04154:   1..1111111   -> L4237
109   L04155:   .....111..
110   L04156:   .....111..
111   L04157:   .....111..
112   L04160:   .....111..
113   L04161:   .....111..
114   L04162:   ..11...11.
115   L04163:   .....111..
116   L04164:   .....111..
117   L04165:   .....111..
118   L04166:   .....111..
119   L04167:   1...1.11..
120   L04170:   11..1.111    -> L4305
121   L04171:   1.11111..1   -> L4276
122   L04172:   1...1...1..
123   L04173:   11........
124   L04174:   ..11.1.1..
125   L04175:   ....1....11   -> L4020
126   L04176:   111.1111.   -> L4343
127   L04177:   1.1.1.11.
128   L04200:   1.111.1.11   -> L4272
129   L04201:   ...11..1.1   -> L4031
130   L04202:   111.1..11   -> L4350
131   L04203:   1.1111.1.1   -> L4275
132   L04204:   ..11.1.1..
133   L04205:   ....111111   -> L4017
134   L04206:   111...1.11   -> L4342
135   L04207:   ..........
136   L04210:   .1........
137   L04211:   .....11.1.
138   L04212:   1.......1.
139   L04213:   .11111111.
140   L04214:   ..11....11.
141   L04215:   ..1.1.1...
142   L04216:   .1.1.111.1   -> L4127
```

```
UFCN7  :  C + 1 -> C[S]
          CLEAR STATUS
          1 -> S10
          JSB UFCN6
FCN23  :  IF P # 13
              THEN GO TO FCN27
          A - 1 -> A[XS]
          IF NO CARRY GO TO FCN24
          JSB EXCG
          NO-OPERATION
FCN7   :  C + 1 -> C[P]
          IF S8 # 1
              THEN GO TO FCN8
FCN26  :  C EXCHANGE M
          CLEAR STATUS
          1 -> S8
          GO TO RTN7
MCIRC0 :  0 -> S11
MCIRC1 :  0 -> F5
          IF S11 # 1
              THEN GO TO MCIRC1
          0 -> F5
          RETURN
CLR20  :  3 -> P
          IF C[P] = 0
              THEN GO TO CLR23
          MEMORY DELETE
          JSB MCIRC0
CLR21  :  MEMORY DELETE
          JSB ARSTR2
          GO TO FCN20
          11 -> P
          IF C[P] >= 1
              THEN GO TO UFCN3
          10 -> P
          IF C[P] >= 1
              THEN GO TO UFCN8
          SELECT ROM 5
          GO TO PAD2
P3     :  P - 1 -> P
P4     :  P - 1 -> P
P5     :  P - 1 -> P
P6     :  P - 1 -> P                    60,56,62
P7     :  P - 1 -> P
          0 -> C[P]
P8     :  P - 1 -> P
P9     :  P - 1 -> P
P10    :  P - 1 -> P
P11    :  P - 1 -> P
FCN0   :  IF P # 0
              THEN GO TO FCN1
          JSB ARSTR1
          1 -> S9
          POINTER ADVANCE
          IF S3 # 1
              THEN GO TO FCN2
          GO TO FCN20
FCN9   :  IF P # 10
              THEN GO TO FCN10
          JSB XEQY
          GO TO LBR1
FCN19  :  JSB ARSTR2
FCN22  :  IF S3 # 1
              THEN GO TO FCN21
          GO TO FCN13
          NO OPERATION
RTN2   :  MARK AND SEARCH
          CLEAR STATUS
          1 -> S8
          C + 1 -> C[S]
          0 -> C[M]
          C EXCHANGE M
          JSB MCIRC0
```

| # | Label | Bits | Jump | | Mnemonic | Instruction |
|---|---|---|---|---|---|---|
| 143 | L04217: | ..1..1.... | -> L1220 | ***** | RTN7 : | SELECT ROM 1 |
| 144 | L04220: | 1..11.11.. | | | FCN4 : | IF P # 9  66,68 |
| 145 | L04221: | .1.1....11 | -> L4120 | | | THEN GO TO FCN7 |
| 146 | L04222: | ..11.1.1.. | | | | IF S3 # 1 |
| 147 | L04223: | 1.1.....11 | -> L4240 | | | THEN GO TO RTN0 |
| 148 | L04224: | 11.1111111 | -> L4337 | | | GO TO FCN8 |
| 149 | L04225: | 11.1111.1. | | | FCN24 : | A - 1 -> A[XS] |
| 150 | L04226: | ...1111.111 | -> L4075 | | | IF NO CARRY GO TO FCN25 |
| 151 | L04227: | ....11.1.1 | -> L4015 | | | JSB RDN |
| 152 | L04230: | 1.1.11.1.. | | ***** | CLR23 : | DELAYED SELECT GROUP 1 |
| 153 | L04231: | .1....1.... | -> L2232 | ***** | | SELECT ROM 2 |
| 154 | L04232: | ..1.1..... | | | PAD1 : | 1 -> F1 |
| 155 | L04233: | 11........ | | | PAD0 : | POINTER ADVANCE |
| 156 | L04234: | .1.1.111.1 | -> L4127 | | | JSB MCIRC0 |
| 157 | L04235: | 11........ | | | PAD3 : | POINTER ADVANCE |
| 158 | L04236: | .1.1.111.1 | -> L4127 | | | JSB MCIRC0 |
| 159 | L04237: | .1....1.... | -> L2240 | ***** | PAD2 : | SELECT ROM 2 |
| 160 | L04240: | 1.....1.1.. | | | RTN0 : | IF S8 # 1 |
| 161 | L04241: | 11.11.1.11 | -> L4332 | | | . THEN GO TO RTN1 |
| 162 | L04242: | .11.11111. | | | | IF C[S] = 0 |
| 163 | L04243: | 1...1...11 | -> L4210 | | | THEN GO TO RTN2 |
| 164 | L04244: | .1.111111.. | | | | C - 1 -> C[S] |
| 165 | L04245: | .11.11111. | | | | IF C[S] = 0 |
| 166 | L04246: | 11.111..11 | -> L4334 | | | THEN GO TO RTN3 |
| 167 | L04247: | 1.1.11..11 | -> L4254 | | | GO TO RTN6 |
| 168 | L04250: | 1.1....... | | | RTN5 : | SEARCH FOR LABEL |
| 169 | L04251: | .1.1.111.1 | -> L4127 | | | JSB MCIRC0 |
| 170 | L04252: | 111.1..... | | | | 1 -> F7 |
| 171 | L04253: | ..1..111.1 | -> L4047 | | | JSB RSETP |
| 172 | L04254: | 1.1....... | | | RTN6 : | SEARCH FOR LABEL |
| 173 | L04255: | .1.1.111.1 | -> L4127 | | | JSB MCIRC0 |
| 174 | L04256: | 11.111..11 | -> L4334 | | | GO TO RTN3 |
| 175 | L04257: | 1.1....... | | | UFCN3 : | SEARCH FOR LABEL |
| 176 | L04260: | .1.1.111.1 | -> L4127 | | UFCN9 : | JSB MCIRC0 |
| 177 | L04261: | 1111....11 | -> L4360 | | | GO TO UFCN8 |
| 178 | L04262: | ..11.1.1.. | | | FCN3 : | IF S3 # 1 |
| 179 | L04263: | 1.11.11.11 | -> L4266 | | | THEN GO TO FCN15 |
| 180 | L04264: | .11....... | | | | MEMORY DELETE |
| 181 | L04265: | .1.1.111.1 | -> L4127 | | | JSB MCIRC0 |
| 182 | L04266: | 111.1..... | | | FCN15 : | 1 -> F7 |
| 183 | L04267: | 1..11.11. | | | | IF P # 9 |
| 184 | L04270: | .111111111 | -> L4177 | | | THEN GO TO FCN9 |
| 185 | L04271: | ..1..1..1.1 | -> L4051 | | | JSB XGTY |
| 186 | L04272: | 1.111.11.. | | | FCN10 : | IF P # 11 |
| 187 | L04273: | ..11111111 | -> L4077 | | | THEN GO TO FCN11 |
| 188 | L04274: | ..11.111.1 | -> L4067 | | | JSB XLEY |
| 189 | L04275: | ..11...11. | | | ARSTR2: | 0 -> C[M] |
| 190 | L04276: | ..1.1.1... | | | ARSTR1: | C EXCHANGE M |
| 191 | L04277: | 1.11..111. | | | ARSTR0: | SHIFT RIGHT A[W] |
| 192 | L04300: | .11..1111. | | | | C -> A[S] |
| 193 | L04301: | ....11.... | | | | RETURN |
| 194 | L04302: | 1.1....... | | | UFCN5 : | SEARCH FOR LABEL |
| 195 | L04303: | .1....11.11 | -> L4106 | | | GO TO UFCN7 |
| 196 | L04304: | 1..11.1111 | -> L4233 | | | GO TO PAD0 |
| 197 | L04305: | .11.1..11. | | | FCN1 : | IF C[M] = 0  58,56 |
| 198 | L04306: | .1..1..11 | -> L4220 | | | THEN GO TO FCN4 |
| 199 | L04307: | .1.11..11. | | | | C - 1 -> C[M] |
| 200 | L04310: | .11.1..11. | | | | IF C[M] = 0  64 |
| 201 | L04311: | 1.11..1.11 | -> L4262 | | | THEN GO TO FCN3 |
| 202 | L04312: | ..11...11. | | | FCN6 : | 0 -> C[M] |
| 203 | L04313: | 11111..... | | | | 0 -> F7 |
| 204 | L04314: | 1..1....11 | -> L4220 | | | GO TO FCN4 |
| 205 | L04315: | ...11.1.... | | | | KEYS -> ROM ADDRESS |
| 206 | L04316: | .1.1..11.. | | | | 5 -> P |
| 207 | L04317: | .11.1....1. | | | | IF C[P] = 0 |
| 208 | L04320: | ..11....11 | -> L4060 | | | THEN GO TO ARTH4 |
| 209 | L04321: | ..11...11. | | | | 0 -> C[M] |
| 210 | L04322: | .1.....1.1. | | | | SHIFT LEFT A[X] |
| 211 | L04323: | .1.....1.1. | | | | SHIFT LEFT A[X] |
| 212 | L04324: | .1111....1. | | | | C + 1 -> C[P] |
| 213 | L04325: | .1111....1. | | | ST036 : | C + 1 -> C[P] |
| 214 | L04326: | 11.1111.1. | | | | A - 1 -> A[XS] |

```
215  L04327:  11.1.1.111  -> L4325              IF NO CARRY GO TO STO36
216  L04330:  ..1.1.1...                        C EXCHANGE M
217  L04331:  1...111111  -> L4217              GO TO RTN7
218  L04332:  1..1.1.1.                RTN1  :  IF S9 # 1
219  L04333:  1.1....11   -> L4250                  THEN GO TO RTN5
220  L04334:  .11.1.11.                RTN3  :  0 -> C[MS]
221  L04335:  ..1.1.1...                        C EXCHANGE M
222  L04336:  ..1..1....  -> L1337  *****       SELECT ROM 1
223  L04337:  1.11111..1  -> L4276     FCN8  :  JSB ARSTR1
224  L04340:  ..11.1.1..               FCN16 :  IF S3 # 1
225  L04341:  1...111111  -> L4217                 THEN GO TO RTN7   DISPLAY
226  L04342:  ..1.......               FCN13 :  MEMORY INSERT
227  L04343:  .1.1.111.1  -> L4127     FCN20 :  JSB MCIRC3
228  L04344:  .11.1....                FCN5  :  1 -> F0
229  L04345:  1...111111  -> L4217              GO TO RTN7        DISPLAY
230  L04346:  1.1111.1.1  -> L4275              JSB ARSTR2
231  L04347:  111...1.11  -> L4343              GO TO FCN13
232  L04350:  ...1......               LBR1  :  BUFFER -> ROM ADDRESS
233  L04351:  ........11  -> L4000              GO TO NOOP
234  L04352:  1.111.....               UFCN0 :  0 -> F5
235  L04353:  .11.1..11.                        IF C[M] = 0
236  L04354:  11111..111  -> L4371                  THEN GO TO UFCN1
237  L04355:  1.1...11..                        10 -> P
238  L04356:  .11.1....1                        IF C[P] = 0
239  L04357:  1111.11.11  -> L4366                  THEN GO TO UFCN2
240  L04360:  ..11...11.               UFCN8 :  0 -> C[M]
241  L04361:  ..1.1.1...                        C EXCHANGE M
242  L04362:  ...1.1.111  -> L4045              GO TO UFCN10
243  L04363:  11111..11.               FCN28 :  IF P # 15
244  L04364:  11..1.1.11  -> L4312                  THEN GO TO FCN6
245  L04365:  .........1  -> L4000              JSB NOOP
246  L04366:  1.11..11..               UFCN2 :  11 -> P
247  L04367:  ...11...1.                        IF C[P] >= 1
248  L04370:  1.1.111111  -> L4257                  THEN GO TO UFCN3
249  L04371:  ..11.1.11.               UFCN1 :  0 -> C[MS]
250  L04372:  1....1.1..                        IF S8 # 1
251  L04373:  .1....1.11  -> L4102                  THEN GO TO UFCN4
252  L04374:  .1........                        MARK AND SEARCH
253  L04375:  .......11..                       CLEAR STATUS
254  L04376:  1.....1..1               UFCN6 :  1 -> S8
255  L04377:  1.11....11  -> L4260              GO TO UFCN9
ROM05 OBJECT PROGRAM

0  L05000:  ..........               DUMMY :  NO OPERATION
  1  L05001:  1.11111111  -> L5277     ERR2  :  GO TO ERR1
  2  L05002:  11111.1.1.               DIG4  :  A + 1 -> A[X]
  3  L05003:  11111.1.1.               DIG3  :  A + 1 -> A[X]
  4  L05004:  11111.1.1.               DIG2  :  A + 1 -> A[X]
  5  L05005:  ..1....11   -> L5044              IF NO CARRY GO TO DIG1
  6  L05006:  1....1.111  -> L5205     MPY   :  GO TO MPY1
  7  L05007:  111..1....  -> L7010  ***** FNL1 : SELECT ROM 7
  8  L05010:  1111.....1  -> L5360     XNEY  :  JSB SETRL2
  9  L05011:  11.1..111.                        A - C -> A[W]
 10  L05012:  1.11111...                        DATA -> C
 11  L05013:  1..11.111.                        IF A[W] >= 1
 12  L05014:  11.1.11.11  -> L5326                 THEN GO TO FRTN9
 13  L05015:  11..1.1111  -> L5303              GO TO RL2
 14  L05016:  1.111.111                INX1  :  0 -> A[W]
 15  L05017:  11111...1.                        A + 1 -> A[P]
 16  L05020:  ....1.111.               DIV2  :  0 -> B[W]
 17  L05021:  11...1....  -> L6022  ***** FNL3 : SELECT ROM 6
 18  L05022:  11111.1.1.               DIG7  :  A + 1 -> A[X]
 19  L05023:  11111.1.1.               DIG6  :  A + 1 -> A[X]
 20  L05024:  11111.1.1.               DIG5  :  A + 1 -> A[X]
 21  L05025:  .....1.11   -> L5002              IF NO CARRY GO TO DIG4
 22  L05026:  1..11.1.11  -> L5232     ADD1  :  GO TO ADD8
 23  L05027:  1111111.1.               FDGT5 :  A + 1 -> A[XS]
 24  L05030:  1..11...11  -> L5230              IF NO CARRY GO TO FDGT6
 25  L05031:  .1.1..1111  -> L5123              GO TO TAN2
 26  L05032:  1111.....1  -> L5360     XEQY  :  JSB SETRL2
 27  L05033:  11.1..111.                        A - C -> A[W]
 28  L05034:  1.11111...                        DATA -> C
```

| | | | | |
|---|---|---|---|---|
| 29 | L05035: | 1...11.111. | | |
| 30 | L05036: | 11....1111 | -> L5303 | |
| 31 | L05037: | 11.1.11.11 | -> L5326 | |
| 32 | L05040: | 1111111.1. | | |
| 33 | L05041: | .1.1....11 | -> L5120 | |
| 34 | L05042: | ...1...1.. | | |
| 35 | L05043: | 1..1...111 | -> L5221 | |
| 36 | L05044: | 11111.1.1. | -> L5106 | |
| 37 | L05045: | .1...11.11 | -> L5106 | |
| 38 | L05046: | 1....11111 | -> L5207 | |
| 39 | L05047: | 1111111.1. | | |
| 40 | L05050: | .11..11.11 | -> L5146 | |
| 41 | L05051: | .1.1..1.11 | -> L5122 | |
| 42 | L05052: | 111.111..1 | -> L5356 | |
| 43 | L05053: | ...1111111. | | |
| 44 | L05054: | 1..11.11.1 | -> L5233 | |
| 45 | L05055: | 1.11111... | | |
| 46 | L05056: | ..11....11 | -> L5060 | |
| 47 | L05057: | .11..1.... | -> L3060 | |
| 48 | L05060: | 1..111.11. | | |
| 49 | L05061: | .1111.111 | -> L5075 | |
| 50 | L05062: | 11....1111 | -> L5303 | |
| 51 | L05063: | 11111.1.1. | | |
| 52 | L05064: | 11111.1.1. | | |
| 53 | L05065: | ...1..1.11 | -> L5022 | |
| 54 | L05066: | 1..11..111 | -> L5231 | |
| 55 | L05067: | 11...1.111 | -> L5305 | |
| 56 | L05070: | 111.111..1 | -> L5356 | |
| 57 | L05071: | 111.1.111. | | |
| 58 | L05072: | .1111111. | | |
| 59 | L05073: | 1..11.11.1 | -> L5233 | |
| 60 | L05074: | 1.11111 .. | | |
| 61 | L05075: | 111111111. | | |
| 62 | L05076: | 11.1.11.11 | -> L5326 | |
| 63 | L05077: | 11....1111 | -> L5303 | |
| 64 | L05100: | 1111111.1. | | |
| 65 | L05101: | 1.11...11 | -> L5260 | |
| 66 | L05102: | .1.1...1.. | | |
| 67 | L05103: | 1.11..1.11 | -> L5262 | |
| 68 | L05104: | 1.1.11.1.. | | |
| 69 | L05105: | ..1..1.... | -> L1106 | |
| 70 | L05106: | .11.1..11. | | |
| 71 | L05107: | 11.1111.11 | -> L5336 | |
| 72 | L05110: | .1...1..1. | -> L2111 | |
| 73 | L05111: | .1...1.... | -> L2112 | |
| 74 | L05112: | 1111111.1. | | |
| 75 | L05113: | .1.11.1111 | -> L5133 | |
| 76 | L05114: | .....1.... | -> L0115 | |
| 77 | L05115: | 11...11.1. | | |
| 78 | L05116: | 11.1..11.. | | |
| 79 | L05117: | 11..1..11 | -> L5310 | |
| 80 | L05120: | 1111111.1. | | |
| 81 | L05121: | ...1.11111 | -> L5027 | |
| 82 | L05122: | 1..1....1.. | | |
| 83 | L05123: | .1.1...1.. | | |
| 84 | L05124: | ..1..1.11 | -> L5042 | |
| 85 | L05125: | ..11...11. | | |
| 86 | L05126: | ..1.1.1.. | | |
| 87 | L05127: | .11.111.11 | -> L5156 | |
| 88 | L05130: | 1.11.1.1.1 | -> L5265 | |
| 89 | L05131: | .11..1.... | -> L3132 | |
| 90 | L05132: | ..1.111111 | -> L5057 | |
| 91 | L05133: | 1111111.1. | | |
| 92 | L05134: | 11..1.1.11 | -> L5312 | |
| 93 | L05135: | 1.11..1111 | -> L5263 | |
| 94 | L05136: | 11.111..1. | | |
| 95 | L05137: | 11.1.1..11 | -> L5324 | |
| 96 | L05140: | .11.1.1... | | |
| 97 | L05141: | .1..1.1... | | |
| 98 | L05142: | 111.1.111. | | |
| 99 | L05143: | .11....1.. | | |
| 100 | L05144: | ..1....1.. | | |

```
                    IF A[W] >= 1
                       THEN GO TO RL2
                    GO TO FRTN9
          FDGT3 :   A + 1 -> A[XS]
                    IF NO CARRY GO TO FDGT4
          TAN1  :   1 -> S1
                    GO TO SQT1
          DIG1  :   A + 1 -> A[X]
                    IF NO CARRY GO TO DIG10
          DIV1  :   GO TO MPY3
          FIDGT4:   A + 1 -> A[XS]
                    IF NO CARRY GO TO FIDGT5
                    GO TO COS1
          XGTY  :   JSB SETRL0
                    0 - C - 1 -> C[S]
                    JSB ADD3
                    DATA -> C
                    GO TO RL4
*****     FNL2  :   SELECT ROM 3
          RL4   :   IF A[MS] >= 1
                       THEN GO TO RL5
                    GO TO RL2
          DIG9  :   A + 1 -> A[X]
          DIG8  :   A + 1 -> A[X]
                    IF NO CARRY GO TO DIG7
          SUB1  :   GO TO ADD2
                    GO TO FRAC1
          XLEY  :   JSB SETRL0
                    A EXCHANGE C[W]
                    0 - C - 1 -> C[S]
                    JSB ADD3
                    DATA -> C
          RL5   :   A + 1 -> A[S]
                    IF NO CARRY GO TO FRTN9
                    GO TO RL2
          FDGT1 :   A + 1 -> A[XS]
                    IF NO CARRY GO TO FDGT2
          LOG1  :   1 -> S5
                    GO TO LN1
*****     SDGT7 :   DELAYED SELECT GROUP 1
*****               SELECT ROM 1
          DIG10 :   IF C[M] = 0
                       THEN GO TO DIG11
*****               SELECT ROM 2
*****     DIG12 :   SELECT ROM 2
          FIDGT1:   A + 1 -> A[XS]
                    IF NO CARRY GO TO FIDGT2
*****               SELECT ROM 0
          GDGT15:   A - B -> A[XS]
                    13 -> P
                    GO TO GDGT12
          FDGT4 :   A + 1 -> A[XS]
                    IF NO CARRY GO TO FDGT5
          COS1  :   1 -> S9
          TAN2  :   1 -> S5
                    GO TO TAN1
          GDGT4 :   0 -> C[M]
                    C EXCHANGE M
                    GO TO GDGT17
                    JSB SAVX1
*****               SELECT ROM 3
                    GO TO FNL2
          FIDGT2:   A + 1 -> A[XS]
                    IF NO CARRY GO TO FIDGT3
                    GO TO LOG2
          GDGT4 :   A - 1 -> A[XS]
                    IF NO CARRY GO TO ABS0
                    STACK -> A
                    C -> STACK
                    A EXCHANGE C[W]
          YTX1  :   1 -> S6
          YTX2  :   1 -> S2
```

| | | | | |
|---|---|---|---|---|
| 101 | L05145: | .....11111 | -> L5007 | |
| 102 | L05146: | 1111111.1. | | |
| 103 | L05147: | .11.11.111 | -> L5155 | |
| 104 | L05150: | .1.1.1111 | -> L5123 | |
| 105 | L05151: | 1.11.11..1 | -> L5266 | |
| 106 | L05152: | ...1..... | | |
| 107 | L05153: | .....1..11 | -> L5000 | |
| 108 | L05154: | 1...1.1111 | -> L5213 | |
| 109 | L05155: | .11..1... | -> L3156 | |
| 110 | L05156: | ....1.111 | | |
| 111 | L05157: | 11.1111.1. | | |
| 112 | L05160: | 11.1..1.11 | -> L5322 | |
| 113 | L05161: | .111..... | | |
| 114 | L05162: | 1.11.1.1.. | | |
| 115 | L05163: | .111.1.111 | -> L5165 | |
| 116 | L05164: | .1..1... | | |
| 117 | L05165: | 11...1... | -> L6166 | |
| 118 | L05166: | 11.1111.1. | | |
| 119 | L05167: | 1111.1.11 | -> L5172 | |
| 120 | L05170: | 111..11.. | | |
| 121 | L05171: | 11...1..11 | -> L5310 | |
| 122 | L05172: | 11.1111.1. | | |
| 123 | L05173: | 111...1111 | -> L5343 | |
| 124 | L05174: | 11...11111 | -> L5307 | |
| 125 | L05175: | .11...11.. | | |
| 126 | L05176: | .11.1...1. | | |
| 127 | L05177: | .1..1...11 | -> L5104 | |
| 128 | L05200: | 1.11.1.1.1 | -> L5265 | |
| 129 | L05201: | 1111111.1. | | |
| 130 | L05202: | .1..1..1.11 | -> L5112 | |
| 131 | L05203: | .....1.... | -> L0204 | |
| 132 | L05204: | 1111111.11 | -> L5376 | |
| 133 | L05205: | ..11..11.. | | |
| 134 | L05206: | ..1.1.1.1. | | |
| 135 | L05207: | .11.1.1... | | |
| 136 | L05210: | ...1....11 | -> L5020 | |
| 137 | L05211: | 111.1.1111 | -> L5353 | |
| 138 | L05212: | 1...11.1111 | -> L5233 | |
| 139 | L05213: | .111..11.. | | |
| 140 | L05214: | .11.1...1. | | |
| 141 | L05215: | .11111.111 | -> L5175 | |
| 142 | L05216: | 1.11.1.1.1 | -> L5265 | |
| 143 | L05217: | 1111111.1. | | |
| 144 | L05220: | .1.....11 | -> L5100 | |
| 145 | L05221: | ....1.111 | | |
| 146 | L05222: | ..1.1111.1 | -> L5057 | |
| 147 | L05223: | .1....1.1. | | |
| 148 | L05224: | .1....1.1. | | |
| 149 | L05225: | ...11...1. | -> L5166 | |
| 150 | L05226: | .111.11.11 | -> L5166 | |
| 151 | L05227: | .....1.... | -> L0230 | |
| 152 | L05230: | .11..1..1. | -> L3231 | |
| 153 | L05231: | ..1111111. | | |
| 154 | L05232: | .11.1.1... | | |
| 155 | L05233: | ....1.111 | | |
| 156 | L05234: | 1111111.1. | | |
| 157 | L05235: | 1111111.1. | | |
| 158 | L05236: | .111111.1. | | |
| 159 | L05237: | .111111.1. | | |
| 160 | L05240: | ...1..1.1. | | |
| 161 | L05241: | 1.1...1111 | -> L5243 | |
| 162 | L05242: | 111.1.111. | | |
| 163 | L05243: | 111.1..11. | | |
| 164 | L05244: | .11.1..11. | | |
| 165 | L05245: | 1.1..11111 | -> L5247 | |
| 166 | L05246: | 111.1.111. | | |
| 167 | L05247: | 1...1...11 | | |
| 168 | L05250: | ...1..1.1. | | |
| 169 | L05251: | 1.11111.11 | -> L5276 | |
| 170 | L05252: | 1.1...111. | | |
| 171 | L05253: | 11111.1.1. | | |
| 172 | L05254: | ......111. | | |

```
                     GO TO FNL1
          FIDGT5:    A + 1 -> A[XS]
                     IF NO CARRY GO TO FIDGT6
                     GO TO TAN2
                     JSB SAVX3
                     BUFFER -> ROM ADDRESS
                     GO TO DUMMY
                     GO TO SDGT5
*****     FIDGT6:    SELECT ROM 3
          GDGT17:    0 -> B[W]
                     A - 1 -> A[XS]
                     IF NO CARRY GO TO GDGT20
                     0 -> F1
                     IF S11 # 1
                        THEN GO TO PI2
                     C -> STACK
*****     PI2   ,    SELECT ROM 6
          GDGT10:    A - 1 -> A[XS]
                     IF NO CARRY GO TO GDGT11
                     14 -> P
                     GO TO GDGT12
          GDGT11:    A - 1 -> A[XS]
                     IF NO CARRY GO TO GDGT13
                     GO TO GDGT14
          SDGT6 ,    6 -> P
                     IF C[P] = 0
                        THEN GO TO SDGT7
                     JSB SAVX1
                     A + 1 -> A[XS]
                     IF NO CARRY GO TO FIDGT1
                     SELECT ROM 0
                     GO TO STO34
          MPY1  ,    3 -> P
                     0 - C -> C[X]
          MPY3  ,    STACK -> A
                     GO TO DIV2
                     GO TO GDGT16
                     GO TO ADD3
          SDGT5 ,    7 -> P
                     IF C[P] = 0
                        THEN GO TO SDGT6
                     JSB SAVX1
                     A + 1 -> A[XS]
                     IF NO CARRY GO TO FDGT1
          SQT1  ,    0 -> B[W]
                     JSB FNL2
          SDGT0 ,    SHIFT LEFT A[X]
                     SHIFT LEFT A[X]
                     IF C[P] >= 1
                        THEN GO TO GDGT10
                     SELECT ROM 0
          FDGT6 ,    SELECT ROM 3
          ADD2  ,    0 - C - 1 -> C[S]
          ADD8  ,    STACK -> A
          ADD3  ,    0 -> B[W]
                     A + 1 -> A[XS]
                     A + 1 -> A[XS]
                     C + 1 -> C[XS]
                     C + 1 -> C[XS]
                     IF A >= C[X]
                        THEN GO TO ADD4
                     A EXCHANGE C[W]
          ADD4  ,    A EXCHANGE [M]
                     IF C[M] = 0
                        THEN GO TO ADD5
                     A EXCHANGE C[W]
          ADD5  ,    B EXCHANGE C[M]
          ADD6  ,    IF A >= C[X]
                        THEN GO TO ADD7
                     SHIFT RIGHT B[W]
                     A + 1 -> A[X]
                     IF B[W] = 0
```

| | | | |
|---|---|---|---|
| 173 | L05255; | 1.11111.11 -> L5276 | |
| 174 | L05256; | 1.1.1...11 -> L5250 | |
| 175 | L05257; | .......... | |
| 176 | L05260; | 1111111.1. | |
| 177 | L05261; | ..1.....11 -> L5040 | |
| 178 | L05262; | .11....11 | |
| 179 | L05263; | 1..1....1.. | |
| 180 | L05264; | .11..1..11 -> L5144 | |
| 181 | L05265; | ..11...11. | |
| 182 | L05266; | ...1.1.1. | |
| 183 | L05267; | ...1.111. | |
| 184 | L05270; | 1...1.111 | |
| 185 | L05271; | 1..111.... | |
| 186 | L05272; | 1...1.111. | |
| 187 | L05273; | 1.1111.... | |
| 188 | L05274; | 11....11.. | |
| 189 | L05275; | ....11.... | |
| 190 | L05276; | 11...1.. -> L6277 | ***** ADD7 |
| 191 | L05277; | ....11.1.. | ERR1 |
| 192 | L05300; | ..11..111. | |
| 193 | L05301; | .1.1...1.. | |
| 194 | L05302; | 11..111111 -> L5317 | |
| 195 | L05303; | 1....1.... -> L4304 | ***** RL2 |
| 196 | L05304; | .....1.... -> L0305 | ***** GDGT2 |
| 197 | L05305; | 1.11.1.1.1 -> L5265 | FRAC1 |
| 198 | L05306; | .11..1.... -> L3307 | ***** |
| 199 | L05307; | 1111..11.. | GDGT14; |
| 200 | L05310; | 1....1.... -> L4311 | ***** GDGT12; |
| 201 | L05311; | 11.11...11 -> L5330 | |
| 202 | L05312; | .111...1.. | FIDGT3; |
| 203 | L05313; | 1111111.1. | |
| 204 | L05314; | ...1..11111 -> L5047 | |
| 205 | L05315; | ..1....11 -> L5042 | |
| 206 | L05316; | 1...1.1... -> L4317 | ***** SDGT8 ; |
| 207 | L05317; | .1...1.... -> L2320 | ***** ERR3 ; |
| 208 | L05320; | 1..11.1111 -> L5233 | |
| 209 | L05321; | 1111111.11 -> L5376 | |
| 210 | L05322; | 1.11.111.1 -> L5267 | GDGT20; |
| 211 | L05323; | 11...1..11 -> L5304 | |
| 212 | L05324; | ...11.1111. | ABS0 ; |
| 213 | L05325; | .1...1.... -> L2326 | ***** FRTH8 ; |
| 214 | L05326; | .1...1.... -> L2327 | ***** FRTH9 ; |
| 215 | L05327; | .1...1.... -> L2330 | ***** FRTH10; |
| 216 | L05330; | 11.1111.1. | GDGT3 ; |
| 217 | L05331; | .1.1111.11 -> L5136 | |
| 218 | L05332; | ....111.11 -> L5016 | |
| 219 | L05333; | .1....1.1.. | |
| 220 | L05334; | 11.1.1.111 -> L5325 | |
| 221 | L05335; | ....11.... | |
| 222 | L05336; | ..1.1.1... | DIG11 , |
| 223 | L05337; | ..11.1.1.. | |
| 224 | L05340; | .1..1..111 -> L5111 | |
| 225 | L05341; | 1....1.... -> L4342 | ***** DIG13 ; |
| 226 | L05342; | .......... | |
| 227 | L05343; | ..1....11. | GDGT13; |
| 228 | L05344; | 1...1.111. | |
| 229 | L05345; | .1.1.11... | |
| 230 | L05346; | 1..1.111. | |
| 231 | L05347; | 1....11.1. | |
| 232 | L05350; | .1..11.111 -> L5115 | |
| 233 | L05351; | ..11.1.1.. | |
| 234 | L05352; | .1.1.1.111 -> L5125 | |
| 235 | L05353; | ..11...11. | |
| 236 | L05354; | ..1.1.1.. | GDGT16; |
| 237 | L05355; | 111.....111 -> L5341 | |
| 238 | L05356; | ...11...1. | SETRL0; |
| 239 | L05357; | ..1...1..1.. | |
| 240 | L05360; | ..1.1.1... | SETRL2; |
| 241 | L05361; | .....1.111. | |
| 242 | L05362; | 1...1.111. | |
| 243 | L05363; | .1.111111. | |
| 244 | L05364; | 1..1..111. | |

```
              THEN GO TO ADD7
              GO TO ADD6
              NO OPERATION
FDGT2 :       A + 1 -> A[XS]
              IF NO CARRY GO TO FDGT3
LN1   :       1 -> S6
LOG2  :       1 -> S9
              GO TO YTX2
SAVX1 :       0 -> C[M]
SAVX3 :       C EXCHANGE M
SAVX2 :       0 -> B[W]
              B EXCHANGE C[W]
              C -> DATA ADDRESS
              B EXCHANGE C[W]
              C -> DATA
              12 -> P
              RETURN
ADD7  :       SELECT ROM 6
ERR1  :       CLEAR STATUS
              0 -> C[W]
              1 -> S5
              GO TO ERR3
RL2   ,       SELECT ROM 4
GDGT2 :       SELECT ROM 0
FRAC1 :       JSB SAVX1
              SELECT ROM 3
GDGT14;       15 -> P
GDGT12;       SELECT ROM 4
              GO TO GDGT3
FIDGT3;       1 -> S7
              A + 1 -> A[XS]
              IF NO CARRY GO TO FIDGT4
              GO TO TAN1
SDGT8 ;       SELECT ROM 4
ERR3  ;       SELECT ROM 2
              GO TO ADD3
              GO TO STO34
GDGT20;       JSB SAVX2
              GO TO GDGT2
ABS0  ;       0 -> C[S]
FRTH8 ;       SELECT ROM 2
FRTH9 ;       SELECT ROM 2
FRTH10;       SELECT ROM 2
GDGT3 :       A - 1 -> A[XS]
              IF NO CARRY GO TO GDGT4
              GO TO INX1
              IF S4 # 1
                 THEN GO TO FRTH8
              RETURN
DIG11 ,       C EXCHANGE M
              IF S3 # 1
                 THEN GO TO DIG12
DIG13 ;       SELECT ROM 4
              NO OPERATION
GDGT13;       2 -> P
              B EXCHANGE C[W]
              LOAD CONSTANT 5
              B EXCHANGE C[W]
              IF A >= B[XS]
                 THEN GO TO GDGT15
              IF S3 # 1
                 THEN GO TO GDGT1
GDGT16;       0 -> C[M]
              C EXCHANGE M
              GO TO DIG13
SETRL0;       0 -> S1
              0 -> S2
SETRL2;       C EXCHANGE M
              0 -> B[W]
              B EXCHANGE C[W]
              C - 1 -> C[S]
              SHIFT RIGHT C[W]
```

```
245  L05365:  1..111....
246  L05366:  ..1...111.
247  L05367:  .11.1.1...
248  L05370:  1.1111....
249  L05371:  111.1.111.
250  L05372:  .1..1.1...
251  L05373:  .1.....1..
252  L05374:  ....11....
253  L05375:  1..11.11.1   -> L5233
254  L05376:  111...11..
255  L05377:  11.1.1.111   -> L5325
```

```
              C -> DATA ADDRESS
              B -> C[W]
              STACK -> A
              C -> DATA
SETRL1:       A EXCHANGE C[W]
              C -> STACK
              1 -> S4
              RETURN
ST033 :       JSB ADD3
ST034 :       14 -> P
              GO TO FRTN0
```

We claim:

1. A method for storing a sequence of instructions entered via a keyboard into a programmable electronic calculator, the method comprising the steps of electronically:

detecting the actuation of a key on the keyboard;

generating a key code representing the key actuated in response to the detection of the actuation;

deciding whether a status indicator has been set in a status register;

if no status indicator has been set, deciding whether the key code of the key actuated can be merged with a subsequently generated key code; if it can be merged, setting a status indicator and storing the key code; if it cannot be merged, storing the key code; and if a status indicator has been set, deciding whether the key code of the key actuated can be merged with a previously generated and stored key code; if it can be merged, generating a merged key code representing both the previously generated and stored key code and the key code of the key actuated, erasing the status indicator and the previously generated and stored key code, and storing the merged key code; if it cannot be merged, storing the key code of the key actuated and erasing the status indicator.

2. A method of storing a sequence of instructions, entered via a keyboard having function and prefix keys, in a programmable electronic calculator, the method comprising the steps of electronically:

detecting the actuation of a key on the keyboard;

generating a key code representing the key actuated in response to the detection of the actuation;

deciding whether the key actuated can be prefixed;

if the key actuated cannot be prefixed, deciding whether the key actuated is a prefix key; if it is a prefix key, setting a prefix status indicator and storing the key code; if it is not a prefix key, storing the key code;

if the key actuated can be prefixed, deciding whether the key has been prefixed by looking for a prefix status indicator; if it is prefixed, deleting the stored prefix key code and the status indicator, generating a merged key code representing the previously stored prefix key code and the key code of the actuated key and storing the merged key code; if it is not prefixed, storing the key code and deleting the status indicator.

* * * * *